US012580150B2

(12) United States Patent
Straka et al.

(10) Patent No.: US 12,580,150 B2
(45) Date of Patent: Mar. 17, 2026

(54) SYSTEMS AND METHODS FOR ANALYZING A SAMPLE USING CHARGED PARTICLE BEAMS AND ACTIVE PIXEL CONTROL SENSORS

(71) Applicant: FEI Company, Hillsboro, OR (US)

(72) Inventors: Branislav Straka, Brno (CZ); Pavel Stejskal, Brno (CZ); Tomas Vystavel, Brno (CZ); Jakub Holzer, Brno (CZ)

(73) Assignee: FEI Company, Hillsboro, OR (US)

( * ) Notice: Subject to any disclaimer, the term of this patent is extended or adjusted under 35 U.S.C. 154(b) by 272 days.

(21) Appl. No.: 18/545,447

(22) Filed: Dec. 19, 2023

(65) Prior Publication Data

US 2025/0201511 A1    Jun. 19, 2025

(51) Int. Cl.
H01J 37/244        (2006.01)

(52) U.S. Cl.
CPC ..... H01J 37/244 (2013.01); H01J 2237/2441 (2013.01); H01J 2237/24495 (2013.01)

(58) Field of Classification Search
None
See application file for complete search history.

(56) References Cited

U.S. PATENT DOCUMENTS 5,886,353 A * 3/1999 Spivey ................... A61B 6/502
                                                    250/580
8,338,782 B2  12/2012 Luecken et al.

| 9,069,081 | B2 | 6/2015 | Campbell et al. | |
|---|---|---|---|---|
| 9,618,463 | B2 | 4/2017 | Uncovsky et al. | |
| 9,786,483 | B2 | 10/2017 | Heeren et al. | |
| 10,032,599 | B2 | 7/2018 | Kieft | |
| 11,114,275 | B2 | 9/2021 | Stejskal et al. | |
| 2002/0117617 | A1* | 8/2002 | Sinha | H01J 49/025 |
| | | | | 250/397 |
| 2005/0007111 | A1* | 1/2005 | Frydman | G01R 33/4633 |
| | | | | 324/309 |
| 2023/0165541 | A1* | 6/2023 | Xu | A61B 6/032 |
| | | | | 250/309 |
| 2024/0242930 | A1* | 7/2024 | Bex | G01T 1/24 |

OTHER PUBLICATIONS

EP24218633.6, Extended European Search Report, Apr. 25, 2025, 05 pages.

(Continued)

*Primary Examiner* — Marcus H Taningco

(57)        ABSTRACT

Systems and methods taught herein utilize a single detector to provide both unidimensional data (e.g., for direct topographical imaging) and multidimensional data (e.g., for crystallographic data) for a sample that is interrogated with a charged particle beam. In some examples, unidimensional data can include signal intensity due to backscattered electrons received across the entire detector surface while multidimensional data can include signal intensity due to backscattered electrons as a function of pixel position. By obtaining unidimensional data and multidimensional data from a single detector, the unidimensional data and multidimensional data can be obtained at a same location, at a same time, or both at the same location and same time.

20 Claims, 12 Drawing Sheets

(56)  References Cited

OTHER PUBLICATIONS

Faruqi A. R et al., "Electronic Detectors in Electron Microscopy,"
Current Opinion in Structural Biology, Oct. 29, 2007, vol. 17, No.
5, pp. 549-555, XP022324278, ISSN: 0959-440X, DOI:10.1016/J.
SBI.2007.08.014.
Schwarzer R.A., et al., "Backscattered Electron Imaging with an
EBSD Detector," Microscopy Today, Jan. 31, 2015, vol. 23, No. 1,
pp. 12-17, XP093268343, DOI:10.1017/S1551929514001333.
Wright et al. "Electron imaging with an EBSD detector" Elsevier,
Ultramicroscopy, Jun. 6, 2014, vol. 148, pp. 132-145.

* cited by examiner

30 MICROSECONDS

5 MICROSECONDS

1 MICROSECOND

500 NANOSECONDS

300 NANOSECONDS

200 NANOSECONDS

On-axis TKD

RKD

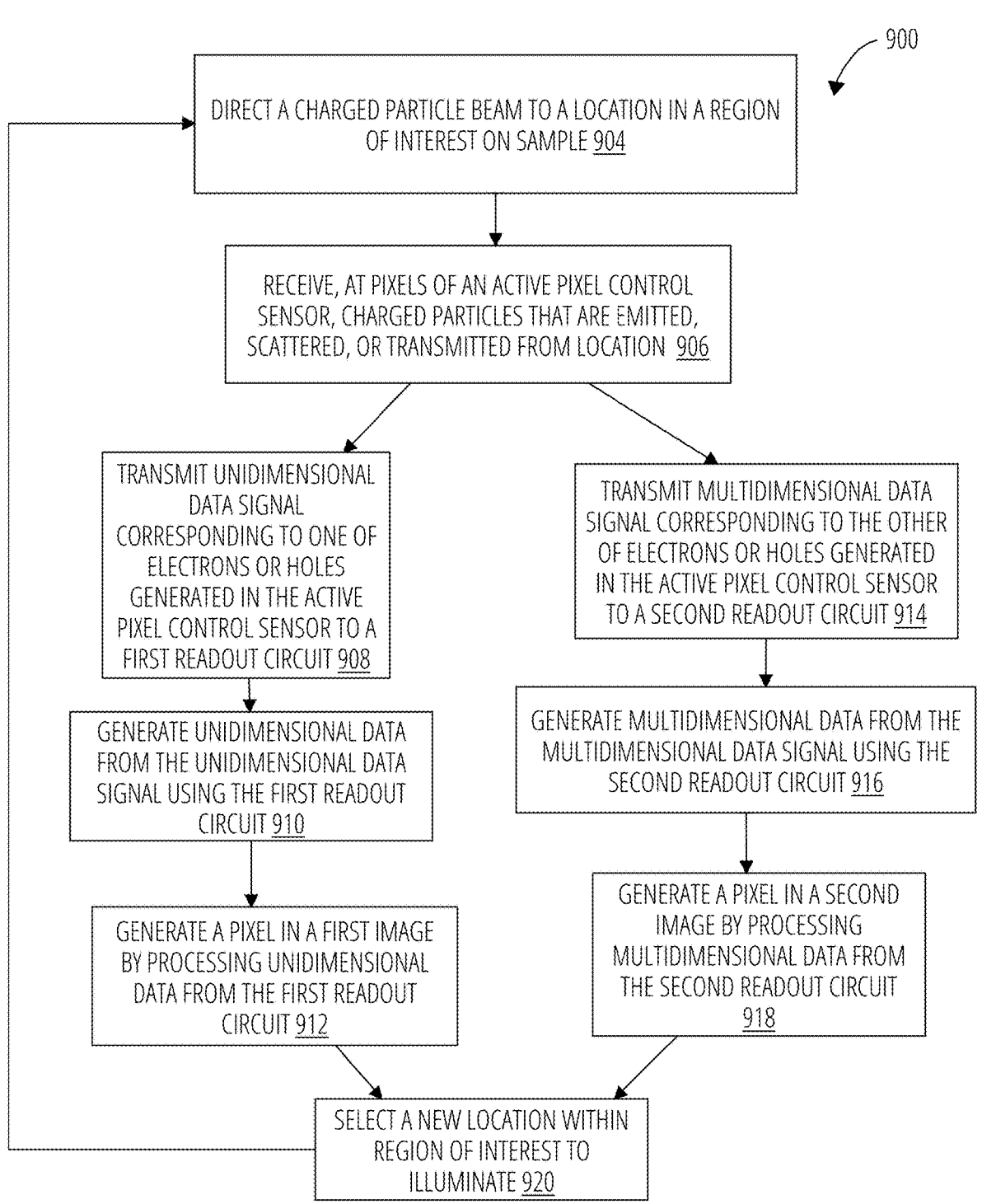

900

DIRECT A CHARGED PARTICLE BEAM TO A LOCATION IN A REGION OF INTEREST ON SAMPLE 904

RECEIVE, AT PIXELS OF AN ACTIVE PIXEL CONTROL SENSOR, CHARGED PARTICLES THAT ARE EMITTED, SCATTERED, OR TRANSMITTED FROM LOCATION 906

TRANSMIT UNIDIMENSIONAL DATA SIGNAL CORRESPONDING TO ONE OF ELECTRONS OR HOLES GENERATED IN THE ACTIVE PIXEL CONTROL SENSOR TO A FIRST READOUT CIRCUIT 908

TRANSMIT MULTIDIMENSIONAL DATA SIGNAL CORRESPONDING TO THE OTHER OF ELECTRONS OR HOLES GENERATED IN THE ACTIVE PIXEL CONTROL SENSOR TO A SECOND READOUT CIRCUIT 914

GENERATE UNIDIMENSIONAL DATA FROM THE UNIDIMENSIONAL DATA SIGNAL USING THE FIRST READOUT CIRCUIT 910

GENERATE MULTIDIMENSIONAL DATA FROM THE MULTIDIMENSIONAL DATA SIGNAL USING THE SECOND READOUT CIRCUIT 916

GENERATE A PIXEL IN A FIRST IMAGE BY PROCESSING UNIDIMENSIONAL DATA FROM THE FIRST READOUT CIRCUIT 912

GENERATE A PIXEL IN A SECOND IMAGE BY PROCESSING MULTIDIMENSIONAL DATA FROM THE SECOND READOUT CIRCUIT 918

SELECT A NEW LOCATION WITHIN REGION OF INTEREST TO ILLUMINATE 920

FIG. 8

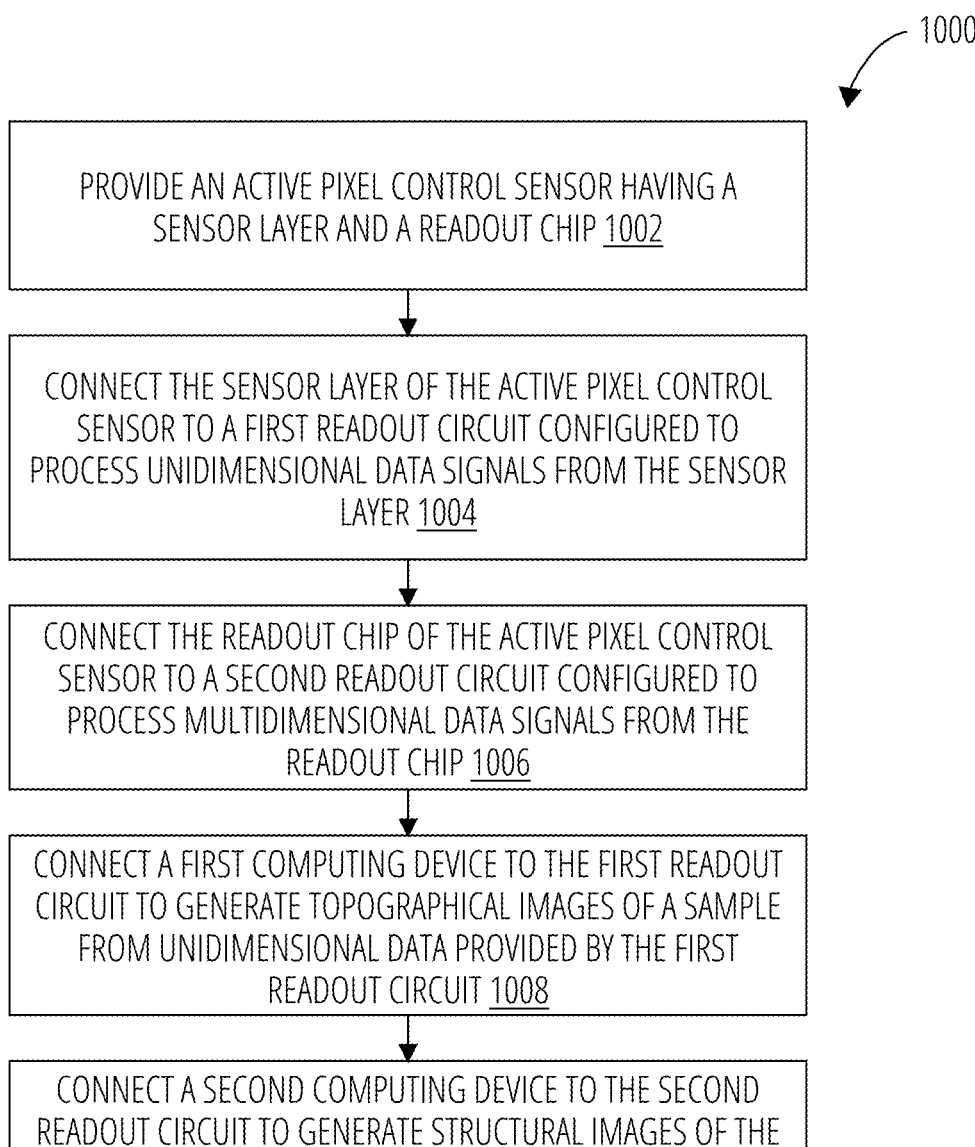

1000

PROVIDE AN ACTIVE PIXEL CONTROL SENSOR HAVING A SENSOR LAYER AND A READOUT CHIP 1002

CONNECT THE SENSOR LAYER OF THE ACTIVE PIXEL CONTROL SENSOR TO A FIRST READOUT CIRCUIT CONFIGURED TO PROCESS UNIDIMENSIONAL DATA SIGNALS FROM THE SENSOR LAYER 1004

CONNECT THE READOUT CHIP OF THE ACTIVE PIXEL CONTROL SENSOR TO A SECOND READOUT CIRCUIT CONFIGURED TO PROCESS MULTIDIMENSIONAL DATA SIGNALS FROM THE READOUT CHIP 1006

CONNECT A FIRST COMPUTING DEVICE TO THE FIRST READOUT CIRCUIT TO GENERATE TOPOGRAPHICAL IMAGES OF A SAMPLE FROM UNIDIMENSIONAL DATA PROVIDED BY THE FIRST READOUT CIRCUIT 1008

CONNECT A SECOND COMPUTING DEVICE TO THE SECOND READOUT CIRCUIT TO GENERATE STRUCTURAL IMAGES OF THE SAMPLE FROM MULTIDIMENSIONAL DATA PROVIDED BY THE SECOND READOUT CIRCUIT 1010

FIG. 9

SYSTEMS AND METHODS FOR ANALYZING A SAMPLE USING CHARGED PARTICLE BEAMS AND ACTIVE PIXEL CONTROL SENSORS

BACKGROUND

When a sample is irradiated with a charged particle beam, such as an electron beam, various charged particles and/or electromagnetic radiation is emitted, scattered, or transmitted as a result of interaction between the charged particle beam and the sample. The emitted, scattered, or transmitted particles and/or radiation can be detected by a detector to provide information about the sample. For example, backscattered electrons are low energy loss electrons that are reflected or backscattered out of an interaction volume of the sample by elastic scattering interactions between the charged particle beam and atoms of the sample. By collecting these charged particles and/or radiation using a two-dimensional detector, a spatial or angular emission/reflection/transmission pattern of the particles or radiation can be determined. Structural information, such as the local crystal orientation, in the interaction volume can then be determined through analysis and interpretation of the two-dimensional pattern.

BRIEF SUMMARY

Provided herein is a charged particle detector system. The charged particle detector system includes an active pixel control sensor having a sensor layer and a readout chip and including a plurality of pixels. Each pixel in the plurality of pixels produces at least an electron and a hole upon being struck by a charged particle. The charged particle detector system includes a first readout circuit in communication with the sensor layer and configured to receive a unidimensional data signal corresponding to one of the electron or hole produced by the charged particle strike. The charged particle detector system includes a second readout circuit in communication with the readout chip and configured to receive a multidimensional data signal corresponding to the other of the electron or hole produced by the charged particle strike.

Provided herein is a method of imaging a sample. The method includes receiving charged particles from a sample at a plurality of pixels in an active pixel control sensor wherein the active pixel control sensor includes a sensor layer and a readout chip. Each pixel in the plurality of pixels produces at least an electron and a hole upon being struck by a charged particle. The method includes transmitting a unidimensional data signal corresponding to one of the electrons or holes produced by the charged particle strikes from the sensor layer to a first readout circuit. The method includes generating unidimensional data from the unidimensional data signal using the first readout circuit. The method includes transmitting a multidimensional data signal corresponding to the other of the electrons or holes produced by the charged particle strikes from the readout chip to a second readout circuit. The method includes generating multidimensional data from the multidimensional data signal using the second readout circuit.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

It is to be understood that the figures are not necessarily drawn to scale, nor are the objects in the figures necessarily drawn to scale in relationship to one another. The figures are depictions that are intended to bring clarity and understanding to various embodiments of apparatuses, systems, and methods disclosed herein. Wherever possible, the same reference numbers will be used throughout the drawings to refer to the same or like parts. Moreover, it should be appreciated that the drawings are not intended to limit the scope of the present teachings in any way.

FIG. 8 illustrates an example method for imaging a sample according to examples taught herein.

FIG. 9 illustrates an example method for assembly of a charged particle detector system in accordance with some examples taught herein.

DETAILED DESCRIPTION

Figure 1:
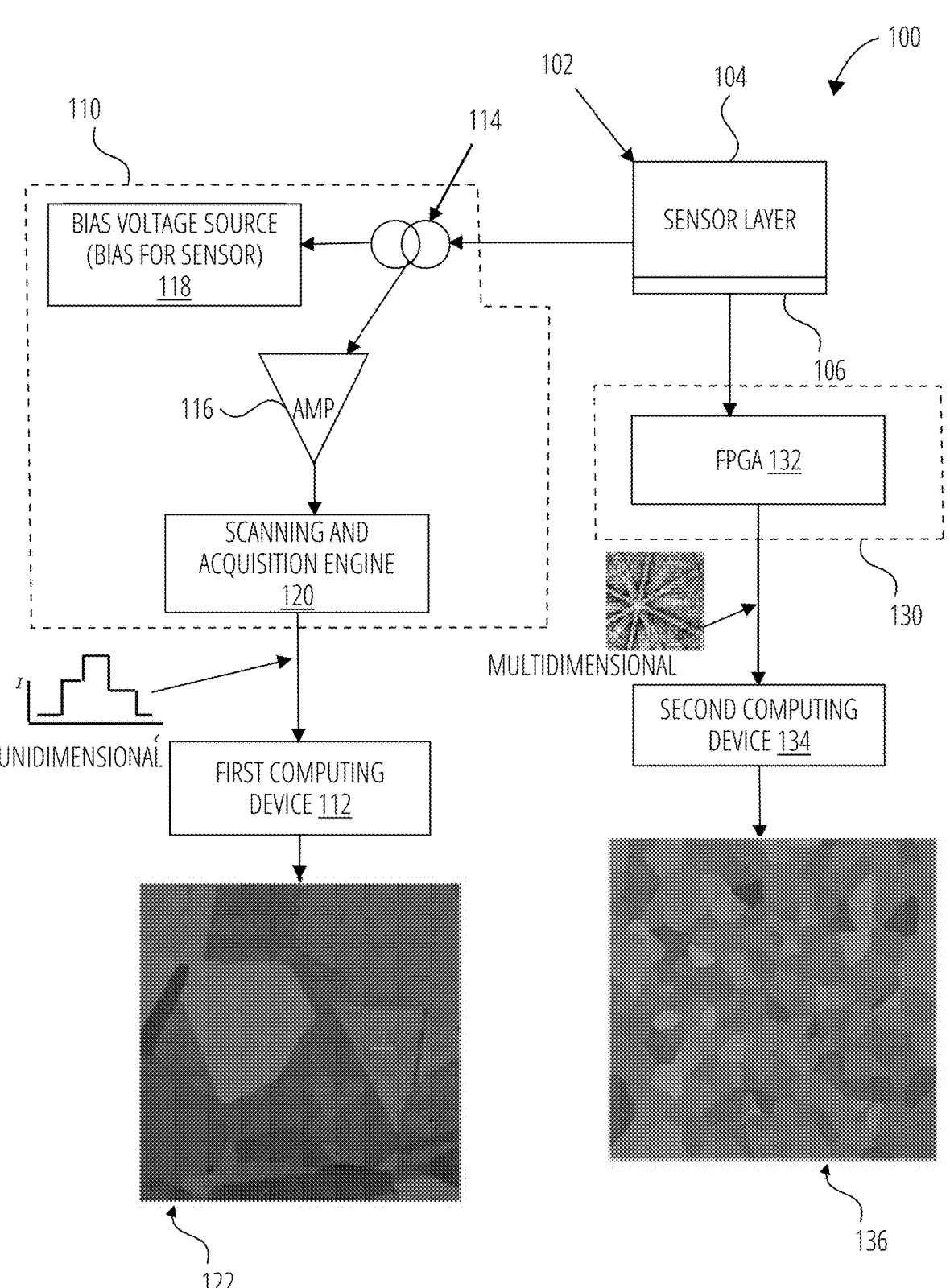
FIG. 1 illustrates a charged particle detector system in accordance with one example taught herein.

Systems and methods taught herein utilize a single detector to provide both unidimensional data (e.g., for direct intensity imaging analogous to secondary electron (SE) or backscattered electron (BSE) imaging in many scanning electron microscope systems) and multidimensional data (e.g., for crystallographic data) for a sample that is interrogated with a charged particle beam. In some examples, unidimensional data can include signal intensity due to backscattered electrons received across the entire detector surface while multidimensional data can include signal intensity due to backscattered electrons as a function of pixel position. In conventional systems, separate detectors are provided to collect unidimensional data and multidimensional data. By obtaining unidimensional data and multidimensional data from a single detector, the unidimensional data and multidimensional data can be obtained at a same location at the same time.

The detector systems and methods taught herein can improve image quality and automate image registration between intensity images and structural images or information by obtaining unidimensional data and multidimensional data at the same time. For applications where it is desired to collect imaging data (i.e., unidimensional data) and structural or diffraction data (i.e., multidimensional data) at the same time, conventional systems in the art placed separate detectors at different positions with respect to the sample (e.g., a first detector in transmission mode and a second detector in reflectance mode). The emission/scattering of secondary charged particles from the sample has an angular dependence. Thus, while the separate detectors can be positioned close to one another, they are not overlapping and will receive somewhat different numbers of charged particle strikes. Similarly, images obtained using two detectors in some conventional setups where detectors are spaced widely apart are not automatically registered and must be transformed into a common coordinate space to enable comparison, overlay, or merging of the images. The detector systems and methods taught herein enable both unidimensional and multidimensional data to be obtained at the same time from the same pixels of a single detector. As a result, unidimensional data and multidimensional data obtained using the systems and methods taught herein can produce images that have the same charged particle intensity content and/or are automatically registered.

In some examples of the systems and methods taught herein, the unidimensional data collected contemporaneously with multidimensional data can be used to estimate parameters such as the noise background or appropriate detector settings. These parameters derived from the unidimensional data can be applied in a live or real-time sense during processing of the multidimensional data. For example, the unidimensional data signal can be used by a computing device to estimate the number of charged particles (e.g., electrons) that are striking the sensor (i.e., total current). The total current information can then be used to estimate and/or set a threshold or an integration time in a readout chip for the multidimensional data signal. The adjustment of parameters of the readout chip can be made during an image (i.e., frame) acquisition or in between image acquisitions.

The detector systems and methods taught herein can improve image quality and speed up acquisition time between intensity images and structural images by obtaining both unidimensional data and multidimensional data at the same location using a single detector. For applications where it is desired to collect imaging data (i.e., unidimensional data) and structural or diffraction data (i.e., multidimensional data) from a same position, conventional systems in the art obtained a first image using a first detector at an imaging position, physically removed the first detector, inserted a second detector at the imaging position, and then obtained the second image. As a result, obtaining imaging data and diffraction data with separate detectors as in the conventional system incurs significant time lag due to the need to substitute detectors. Moreover, the interchanging of detectors means that the detector collecting multidimensional data must be painstakingly located at the desired field of view at the typically slow acquisition rate of the detector, and it is difficult to observe and account for position drift over time. The systems and methods taught herein enable acquisition of both unidimensional data and multidimensional data from the same position using a single detector. The unidimensional data can be used to form intensity images that enable rapid identification of the desired field of view and drift correction during acquisition while the multidimensional data can be used to obtain structural information of the sample.

In some conventional systems, multidimensional data signals from the electron backscatter diffraction (EBSD) detector are binned using hardware modifications and/or software data processing to form segments of unidimensional data. While this process enables the use of a single detector to obtain both intensity and structural images of the sample over time, the readout time is significantly increased (often taking as long as seconds) as data must be obtained first as multidimensional data and then converted to unidimensional data. The readout speed of the multidimensional data can depend on several factors in various systems including the time to readout the per-pixel data and the time to accumulate sufficient charged particle strikes to get over a readout threshold. Moreover, such conventional systems do not allow for contemporaneous production of both a unidimensional data signal and a multidimensional data signal and sacrifice multidimensional image quality by downsampling to form the unidimensional data signal. The present systems and methods overcome such difficulties by producing two data signals contemporaneously with full information content in each signal wherein the first data signal is based on one of holes or electrons produced in the sensor layer while the second data signal corresponds to the other of electrons or holes not used to produce the first data signal. One of the data signals is not bound by the time to readout the per-pixel data or other delays introduced by readout chip electronics in the detector. As such, the systems and methods taught herein increase data acquisition speed over conventional systems by processing multiple data streams in parallel and by enabling processing of at least one data stream faster than another data stream or streams.

By reducing the multiple detectors used in the conventional setup to a single detector as taught herein, additional benefits are derived such as cost savings, system simplification, and fewer components requiring maintenance and service. For example, conventional configurations using separate EBSD and backscattered electron (BSE) detectors leave little free space within a vacuum chamber to maneuver tools and motion stages and can block a large swath of viewing angles. The size of one detector and/or the required orientation of the sample relative to a probe beam (e.g., 700 for standard EBSD) can force the placement of the other detector in a sub-optimal location. Separated detectors can create a need for separate maintenance and service for each detector and additional hardware to power and/or interface with multiple detectors. The present systems and methods taught herein can reduce or eliminate some of these requirements by simplifying the system architecture.

In some examples, systems and methods taught herein can use imaging data obtained from the single detector to locate a region of interest on the sample having specified crystallographic properties as determined by structural data (e.g., diffraction data) received contemporaneously with imaging data from the sample. In particular, the systems and methods taught herein improve location of the region of interest when the detector is used for reflected Kikuchi diffraction (RKD) or EBSD.

As used herein, "unidimensional data" is data that is a function of only a single variable such as time. As an example, unidimensional data that is a function of time encodes no spatial information such as location of a detector pixel within an array of pixels where the data was generated. For a detector with multiple detection elements such as a photomultiplier or pixel array, unidimensional data can be generated from the detector by summing, averaging, or otherwise combining data from multiple detection elements into a single unidimensional data signal.

As used herein, an "intensity image" is an image that is formed using unidimensional data. The pixels of an intensity image usually correspond to an intensity (i.e., number) of charged particle strikes on a detector. Intensity images can convey, through contrast, sample surface information such as illustrating topographical features, Z-contrast (i.e., distinguishing areas in the field of view having different mass (Z) numbers using contrast arising from the difference in emissivity of elements having different mass numbers wherein higher atomic number elements can have stronger scattering), or other features.

As used herein, "multidimensional data" is data that is a function of more than one variable. As an example, multidimensional data can include intensity as a function of time and encoded with spatial information such as the location of a pixel on the detector where the data was generated. In one example, multidimensional data can include a data array where rows and columns of the array correspond to x- and y-positions of pixels in an array of pixels of a detector.

As used herein, a "structural image" is an image that is formed using multidimensional data. The pixels of an intensity image usually correspond to structural information that was determined through processing of the multidimensional data stream (e.g., diffraction data) including, but not limited to, crystallographic phase, crystallographic orientation, or elemental composition. In some examples, the structural image is overlayed upon or otherwise combined with the intensity image to form a composite image.

As used herein, a description of two events happening "contemporaneously" or being "contemporaneous" means that the two events overlap in time. As an example, two data signals arising out of the same charged particle detection event (such as generation of an electron-hole pair in a detector) are contemporaneous.

FIG. 1 illustrates a charged particle detector system 100 in accordance with one example of the present disclosure. The charged particle detector system 100 of FIG. 1 can be used in conjunction with charged particle imaging systems such as the example system illustrated and described with respect to FIG. 5. The charged particle detector system includes an active pixel control sensor 102 having a number of pixels, a first readout circuit 110, and a second readout circuit 130. When a charged particle strikes a pixel in the active pixel control sensor 102, one or more electron-hole pairs are generated as described in more detail below with respect to FIG. 3. The first readout circuit 110 receives a unidimensional data signal corresponding to one or more electrons or holes from a sensor layer 104 of the active pixel control sensor 102 and processes the unidimensional data signal to produce unidimensional data. Unidimensional data can include, for example, data suitable to generate an image of the surface topology or height of features on the sample. The second readout circuit 130 receives a multidimensional data signal corresponding to the other of the holes or electrons (i.e., the one not used by the first readout circuit 110) from the readout chip 106 of the active pixel control sensor 102 and processes the multidimensional data signal to produce multidimensional data. Multidimensional data can include, for example, data suitable to generate images illustrating structural characteristics of the sample such as crystallographic phase. The charged particle detector system 100 produces unidimensional data signals and multidimensional data signals that are co-registered in space, co-registered in time (i.e., contemporaneous), or co-registered in both space and time.

In some examples, the active pixel control sensor 102 can have sensitivity sufficient to enable measurement of single charged particle detection events. The active pixel control sensor 102 can be a hybrid pixel array detector (HPAD), a segmented photodiode such as a segmented silicon photodiode, a monolithic active pixel sensor (MAPS), or any other suitable sensor with individual pixel control. In some embodiments, the active pixel control sensor 102 detects strikes from charged particles such as electrons and ion and does not interact with photons. In various embodiments, the active pixel control sensor 102 can include a number of pixels in a range from 32,000 to 1,000,000 pixels or in a range from 32,000 to 250,000 pixels. In some examples, a surface of the active pixel control sensor 102 can have a length or width in a range from 10 to 40 millimeters or in a range from 20 to 30 millimeters. The pixels can be arranged in a rectangular or square array (e.g., 256 by 256 or 500 by 500), a circular array, or other suitable arrangements to receive charged particles or electromagnetic radiation scattered, emitted, or transmitted from a sample. A pitch of the pixels in an array in the active pixel control sensor 102 can be in a range from 50 to 200 microns or in a range from 50 to 150 microns. In some examples, the pitch can be 55 microns. The use of an array of contiguous pixels in the active pixel control sensor 102 as taught in some examples herein provides an advantage over the use of an array of photomultiplier tubes (PMTs). In arrays of PMTs, there can be a gap or dead space between PMT elements whereby charged particles passing through the gaps are missing in the data. Contiguous pixels avoid this issue because pixels can be placed quite close together, thus ensuring that there are no, or almost no, gaps between pixels where charged particles could be missed.

The first readout circuit 110 receives a unidimensional data signal from the sensor layer 104 of the active pixel control sensor 102 and outputs unidimensional data (e.g., topographical imaging data) to a first computing device 112 for analysis or display. The first readout circuit 110 can include a current mirror 114, a bias voltage source 118, an amplifier 116, and a scanning and acquisition engine 120. The current mirror 114 receives the unidimensional data signal from the active pixel control sensor 102 and generates two identical data signals as outputs. In some embodiments, the imaging signal can include a summation of charges generated in all or a portion of the pixels in the sensor layer 104. One of the unidimensional data signals output by the current mirror 114 is received at the bias voltage source 118. The bias voltage source 118 maintains a voltage differential across the active pixel control sensor 102 to deplete the bulk sensor volume of free charge carriers and to drive movement of electrons and holes generated within the sensor layer 104 due to the passage of charged particles. One of the unidimensional data signals output by the current mirror 114 is received at an amplifier 116. The amplifier magnifies the unidimensional data signal before passing the unidimensional data signal to the scanning and acquisition engine 120 (also referred to in some instances as the patterning imaging acquisition module or PIA). The scanning and acquisition engine 120 can digitize the imaging signal and also can provide control of the amplifier 116. In some examples, the scanning and acquisition engine 120 includes one or more analog-to-digital converters. The scanning and acquisition engine 120 passes the digitized unidimensional data to the first computing device 112. As the charged particle beam is scanned point-by-point over a region of interest of the sample, the first computing device 112 collects unidimensional data for each point and assembles the unidimensional data into an intensity image 122 of the region of interest of the sample. In some examples, the scanning and acquisition engine 120 can control operational parameters of the amplifier 116 such as by setting or controlling gain, offset, or bandwidth of the amplifier 116.

The second readout circuit 130 receives the multidimensional data signal from a readout chip 106 of the active pixel control sensor 102 and decodes the multidimensional data signal to form multidimensional data. The multidimensional data is sent from the second readout circuit 130 to the second computing device 134. In some examples, the second readout circuit 130 can include a field programmable gate array 132 (or FPGA). As described in greater detail below with respect to FIG. 3, the readout chip 106 is interconnected with each pixel of the sensor layer 104 in the active pixel control sensor 102 and can readout a multidimensional data signal corresponding to the generation of holes in each of the pixels of the active pixel control sensor 102. The multidimensional data signal can be a two-dimensional array of intensity values where the x-y position of elements of the array represents pixel position within the active pixel control sensor 102. The readout chip 106 outputs the digitized multidimensional data signal to the field programmable gate array 132. The field programmable gate array 132 controls operation of the readout chip 106 in some examples. For example, the field programmable gate array 132 can set parameters such as energy threshold values or control the master clock of the readout chip 106 as described in greater detail below. In some examples, the FPGA 132 can control pixel analog amplifier behavior in the readout chip 106 such as discharge current and offset, hysteresis control for a comparator circuit in the readout chip 106, and conditions for communication drivers. The FPGA 132 can manage acquisition shutter and mode, pixel masking, and individual threshold adjustments in some examples. The field programmable gate array 132 can decode the multidimensional data signal to form multidimensional data. The multidimensional data is then transferred from the field programmable gate array 132 to the second computing device 134. The second computing device 134 processes the multidimensional data to produce a structural image 136. In some examples, the structural image 136 is overlayed, composited, or otherwise combined with the intensity image 122.

In some examples described above, the unidimensional data signal corresponds to electrons generated within the active pixel control sensor 102 while the multidimensional data signal corresponds to holes generated within the active pixel control sensor 102. It will be understood that the systems and methods taught herein are not so limited and that the unidimensional data signal can correspond to holes generated within the active pixel control sensor 102 while the multidimensional data signal corresponds to electrons generated within the active pixel control sensor 102.

In some examples, readout of the unidimensional data signal corresponding to electrons from the sensor layer 104 is faster than readout of multidimensional data signal corresponding to holes from the readout chip 106. In various examples, the speed to readout the full frame (i.e., signal accumulated in all pixels over a given time) for the unidimensional data signal can be in a range from 100 nanoseconds to 30 microseconds while the speed to readout the full frame for the multidimensional data signal can be in a range from 10 microseconds to 1 second. The speed of full-frame readout of the multidimensional data can be slower than the speed of readout of the unidimensional data for several reasons. In some instances, the additional processing overhead involved in handling the multidimensional data signal introduces delay. In some instances, the acquisition time and/or dwell time of the exciting particle beam at the impact point 203 is increased to ensure a sufficient signal-to-noise level in each bin (e.g., individual pixels) for the multidimensional data signal. Depending upon the application, the unidimensional data signal can thus be faster if signal from all bins is summed and signal-to-noise ratio is thus improved.

In some examples, the unidimensional data output by the first readout circuit 110 is processed by the first computing device 112 to produce images of the surface topography of a sample. In some examples, the unidimensional data signal output by the first readout circuit 110 is processed by the first computing device 112 to produce Z-contrast maps of the surface of the sample, i.e., images of a region of interest where the pixel color identifies a height above baseline of a corresponding location within the region of interest. In some examples, the multidimensional data output by the second readout circuit 130 is processed by the second computing device 134 to produce images of the region of interest containing crystallographic information. In some examples, the pixel color in the image can identify a crystallographic phase or orientation of a corresponding location in the region of interest. In some examples, the crystallographic information in the image can be conveyed using false color or intensity maps. In some examples, the crystallographic information can include information about how many charged particles were received from the corresponding location, information about how good the pattern is, or information about how well the pattern was indexed.

In some examples, the first computing device 112 and the second computing device 134 are separate computing devices that can be co-located or remotely situated. The first computing device 112 and the second computing device 134 can be connected via a network that enables information transfer between the devices. In one example, the first computing device 112 is a computing system attached to the charged particle microscope while the second computing device 134 is a dedicated computing system for data analysis and visualization. In some examples, the first computing device 112 and the second computing device 134 are a same computing device. Further examples of appropriate computing devices for use with the systems and methods taught herein are described below with respect to FIG. 7.

Figure 2:
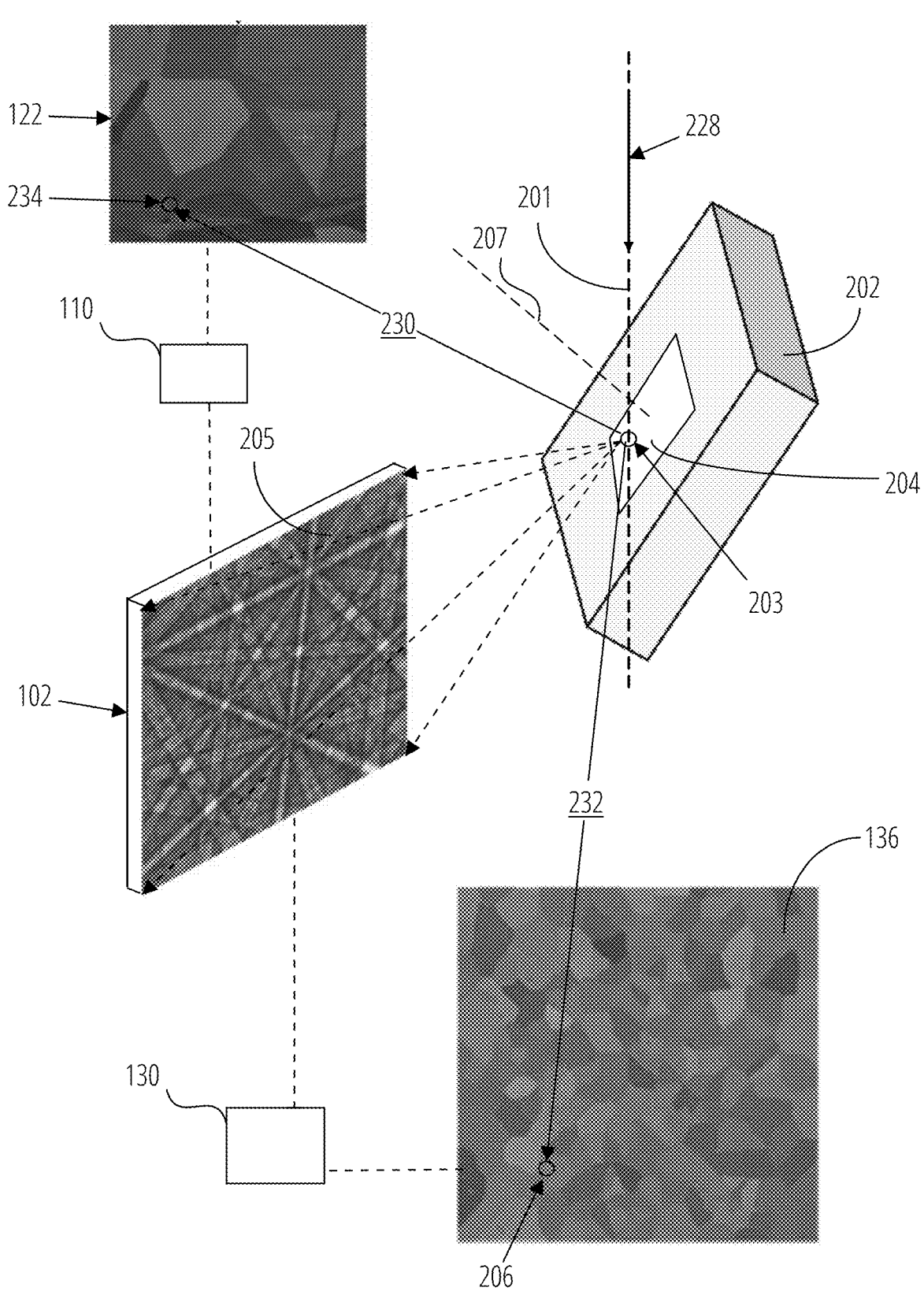
FIG. 2 illustrates an example procedure to obtain both a structural image and an intensity image of a region of interest (ROI) using the charged particle detector system of examples taught herein.

FIG. 2 illustrates an example procedure to obtain both a structural image 136 and an intensity image 122 of a region of interest (ROI) 204 acquired using the charged particle detector system 100 of FIG. 1. This example illustrates an arrangement of elements appropriate for performing electron backscatter diffraction (EBSD) measurements. However, it will be understood that this arrangement of elements is only illustrative and that other arrangements are possible as will be described in greater detail with respect to FIG.

6A-FIG. 6C below. While particular examples are described herein in the context of an electron beam, it will be understood that the systems and methods taught herein are not limited to the use of electron beams but are equally applicable to a variety of charged particle beams such as beams of ions.

In an EBSD experiment, a charged particle beam 228 (such as an electron beam) irradiates a sample 202 along an emission axis 201. The charged particle beam 228 impinges the sample 202 at impact point 203 within the ROI 204 of the sample surface. The impact point 203 can be a volume of the sample 202 that the irradiated elections interact with. Multiple impact points are located within the ROI. Herein, only impact point 203 is shown as an example. The sample 202 is positioned at a fixed angle relative to the emission axis 201 during irradiation of the sample 202 and acquisition of data. For example, the sample axis 207, which is normal to the sample surface, can be positioned 70 degrees relative to the emission axis 201, so that the beam impinges the sample surface at a shallow angle of 20 degrees. In another example, the angle between the sample axis 207 and the emission axis 201 can be less than 45 degrees. While the impact point 203 is irradiated by the charged particle beam 228, backscatter electrons from the impact point 203 are detected by the active pixel control sensor 102.

A two-dimensional electron backscatter pattern 205 (EBSP) is formed on the pixels of the active pixel control sensor 102 by the backscattered electrons from impact point 203. The two-dimensional electron backscatter pattern 205 is transmitted as a multidimensional data signal from the active pixel control sensor 102 to the second readout circuit 130. The second readout circuit 130, alone or in concert with the second computing device 134, can analyze the multidimensional data signal to determine information such as crystal orientation or crystallographic phase at the impact point 203. For example, the crystal orientation can be calculated from the measured Kikuchi bands in the electron backscatter pattern 205. In one example, the crystal orientation is determined by matching known electron backscatter patterns (or simulated versions thereof) with the observed electron backscatter pattern 205. In another example, the crystal orientation is calculated by comparing the measured angles between the Kikuchi bands with theoretical interplanar angles determined using standard crystallographic principles. The second computing device 134 can generate and/or display a structural image 136 in the form of a crystallographic orientation image wherein the crystal orientation of the sample at impact point 203 is color-coded and shown as pixel 206 in the structural image 136. By scanning multiple impact points within the ROI 204, each pixel of the structural image 136 is generated. Each pixel of the structural image 136 corresponds to one impact point 203 in the ROI 204, as indicated by arrow 232.

The active pixel control sensor 102 also produces a unidimensional data signal based upon the electron backscatter pattern 205 that is transmitted to the first readout circuit 110. Unlike the two-dimensional data signal, which includes a full frame readout of all pixels and preserves intensity information as a function of pixel number or location on the active pixel control sensor 102, the unidimensional data signal is a summation or combination of signals from all pixels into a single intensity value. As such, the unidimensional data signal can be proportional to the total flux of charged particles (such as backscattered electrons) that have impinged upon the active pixel control sensor 102. The unidimensional data signal is processed by the first readout circuit 110, alone or in conjunction with the first computing device 112, to produce the intensity image 122. In particular, a pixel 234 of the intensity image 122 can correspond to the magnitude of the unidimensional signal. By scanning multiple impact points within the ROI 204, each pixel of the intensity image 122 is generated. Each pixel of the intensity image 122 corresponds to one impact point 203 in the ROI 204, as indicated by the arrow 230.

The charged particle detector system 100 as taught herein increases the functionality of the active pixel control sensor 102 by enabling the active pixel control sensor 102 to act as both a structural (e.g., materials or crystallographic) imaging sensor and an intensity imaging sensor. In some conventional systems in the art, separate secondary detectors such as forward scatter detectors (FSD) are employed that surround a primary detector such as a pixelated detector. The FSDs collect unidimensional data while the pixelated detector collects multidimensional data. The size of the FSDs is limited and is generally less than the size of the pixelated detector because of limited working space within the vacuum chamber of the instrument. The charged particle detector system 100 taught herein can effectively use the active pixel control sensor 102 as a virtual diode to collect unidimensional data over a large footprint (i.e., the surface of the detector, which can be of the order of 100-2000 mm$^2$). Because the surface of the active pixel control sensor 102 is larger than typical secondary detectors such as FSDs, the active pixel control sensor 102 gathers a greater number of scattered charged particles and thus exhibits improved signal-to-noise as compared to conventional secondary detectors.

The charged particle detector system 100 taught herein can be used to more quickly locate an appropriate or desired ROI 204 by using information from both the unidimensional data signal and the multidimensional data signal. For example, the first readout circuit 110 and first computing device 112 can produce intensity images 122 to orient the user in a live view. Live intensity images 122 can be produced simultaneously or alternately with crystallographic structural images 136 prepared by the second readout circuit 130 and second computing device 134. By comparing (or overlaying or combining) information from the structural image 136 and information from the intensity image 122 while moving the field of view of the sample with respect to the charged particle beam 228, the user can identify the portion of the sample containing either topographical structures of interest or crystallographic phases of interest to help the user define an appropriate ROI 204 for further study.

In some example workflows, EBSD data acquisition for all impact points 203 in the ROI 204 can take minutes or hours to complete. During this long acquisition time, the sample may drift due to thermal or mechanical changes in the system. To compensate for drift, unidimensional data signals can be processed by the first readout circuit 110 intermittently throughout acquisition of a large multidimensional data set to enable drift correction. In some examples, one or several multifunctional data signals are obtained from the active pixel control sensor 102 by the second readout circuit 130, each corresponding to illumination of a different impact point 203 by the charged particle beam 228. Then, the charged particle beam 228 is quickly scanned over the entire ROI 204 to produce unidimensional data signals that enable reconstruction of a full intensity image 122 of the ROI 204. If features of the sample in the ROI 204 have shifted in the intensity image 122, a drift correction can be applied to the previously obtained or subsequently obtained multidimensional data signals corresponding to individual impact points 203.

As described above, data collection for a single image frame is acquired by the active pixel control sensor 102 while the charged particle beam 228 is stationary at the impact point 203. However, in some example workflows, the charged particle beam 228 can be scanned over the sample during acquisition of data signals for a single image frame. In this methodology, the charged particle beam 228 scans continuously and the signal received at the active pixel control sensor 102 is gradually improved over time after each scan of the ROI 204. Examples of this methodology that are compatible with the charged particle detector system 100 taught herein are described in U.S. Pat. No. 11,114,275, granted Sep. 7, 2021 and entitled "Methods and systems for acquiring electron backscatter diffraction patterns," the entire contents of this application being incorporated herein by reference. The charged particle detector system 100 taught herein can advantageously provide seamless drift correction during single-frame multidimensional data acquisition while scanning the beam. Specifically, the charged particle detector system 100 enables simultaneous acquisition of multidimensional data signals and unidimensional data signals whereby the unidimensional data signals can provide drift information that can be used to correct the multidimensional data signals acquired at the same time. For example, a controller or computer system can compare the intensity image and the structural image and determine a drift magnitude and direction by comparing the location of features in the two images. The computer system can then apply a beam shift (i.e., shifting the probe beam to a new location) and can resume or begin further data acquisition. In some examples, the drift correction can be applied during post-processing of the images to ensure alignment of images.

Figure 3:
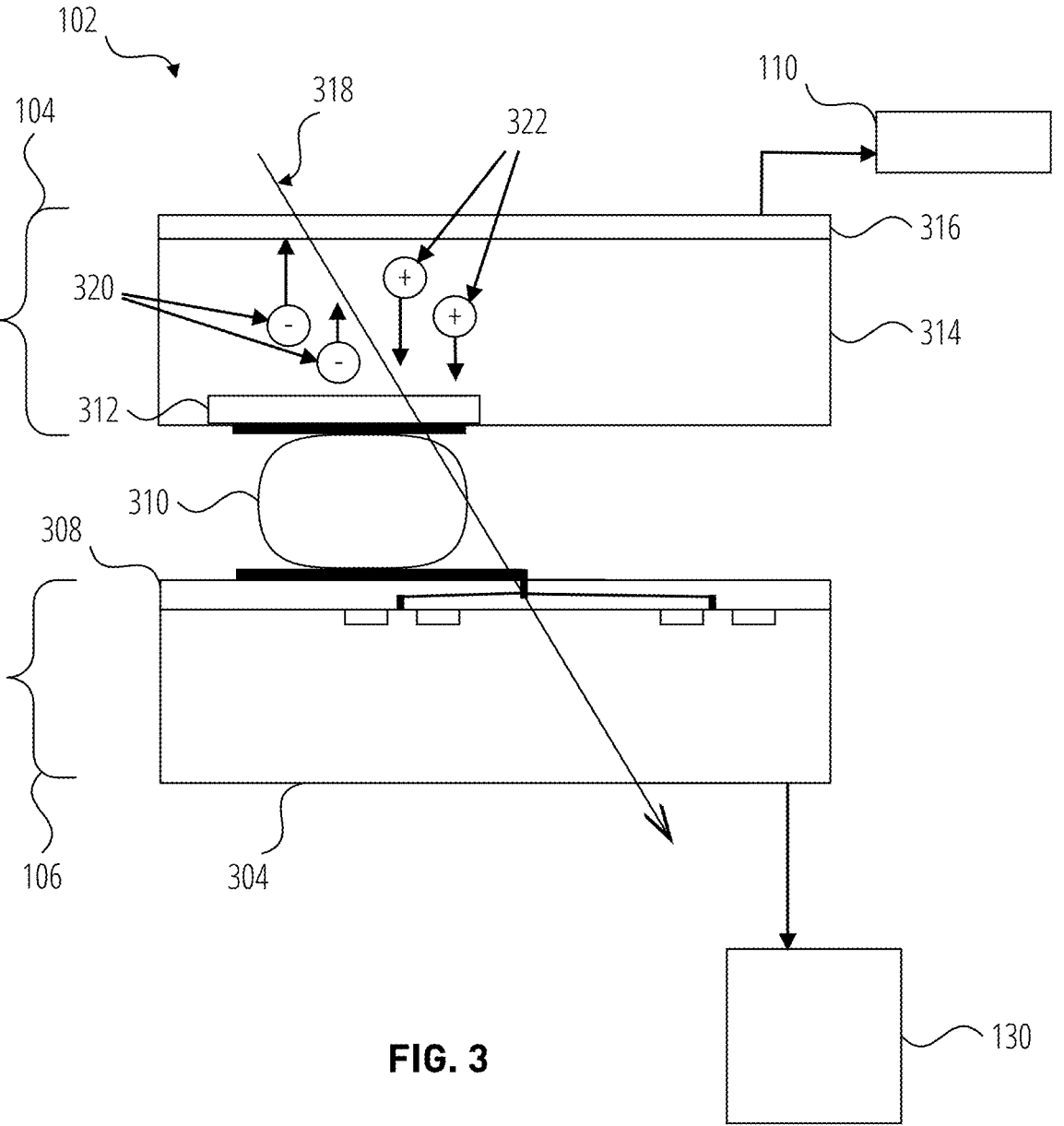
FIG. 3 illustrates a side cross-sectional view of a single pixel in the active pixel control sensor according to some examples described herein.

FIG. 3 illustrates a side cross-sectional view of a single pixel in the active pixel control sensor 102 according to some examples described herein. The active pixel control sensor 102 includes the sensor layer 104 and the readout chip 106. The sensor layer 104 can include a semiconductor bulk 314 and a backside layer 316. The readout chip 106 can include a pixel readout layer 308 on an electronics chip 304. Segmented sections of the sensor layer 104 (i.e., single pixels) are each connected to a corresponding set of readout electronics in the readout chip 106 using, for example, bump bonding through a solder bump 310. In some examples, the active pixel control sensor 102 is sensitive enough to discriminate single charged particle 318 events (i.e., to count the number of charged particle events per pixel during the acquisition time).

In the sensor layer 104, the majority of the semiconductor bulk 314 is generally doped as p-type or n-type while an implant section 312 is doped oppositely to the majority (e.g., if the semiconductor bulk 314 is n-type, the implant section 312 is p-type). When a charged particle 318 passes through the semiconductor bulk 314, one or more electrons 320 and corresponding holes 322 are generated. The electrons 320 are driven towards the backside layer 316 by the applied bias voltage (e.g., applied via the bias voltage source 118 of FIG. 1). Similarly, the holes 322 are driven towards the implant section 312 and through the solder bump 310. The holes 322 are processed by the analog and digital readout electronics in the readout chip 106 to form a digital structural signal for each pixel that can be passed to the second readout circuit 130. In some examples, the readout electronics can include an analog frontend that connects to digital logic blocks. The analog frontend can include circuitry to customize detection parameters such as charge sensitive pre-amplifiers with adaptive gain mode and energy threshold discriminators (to ignore signals that fall below a predetermined energy threshold). The digital logic blocks digitize the amplified signal from the analog frontend. The digital logic blocks can also include or have access to a master clock and can thereby encode additional information into the structural signal including time of acquisition (i.e., timestamp or time duration for which the signal was received) or time over threshold (i.e., timestamp or time duration for the signal intensity was greater than a set threshold). In some embodiments, the digital logic blocks can accept a shutter signal to control the period of time during which holes 322 are accumulated by the readout electronics for processing into the structural signal.

In alternative embodiments, the active pixel control sensor 102 can include a segmented photodiode such as a segmented silicon photodiode. The segmented silicon photodiode can include additional analog frontend or digital backend electronics and can, in some cases, not include energy thresholding or other signal conditioning electronics.

The unidimensional data signal can be transmitted from the sensor layer 104 to the first readout circuit 110 through a custom connector attached to the sensor layer 104. In some embodiments, the custom connector between the sensor layer 104 and the first readout circuit 110 can include a metallic line that supplies bias voltage from voltage source 118 to the backside layer 316. Thus, the current mirror 114 can enable bias voltage to be applied to the backside layer 316 while simultaneously allowing electrical current induced by the charged particle 318 to flow to amplifier 116. In some examples, the current mirror 114 can include a physical connector such as an SMA connector that acts as a signal splitter.

In some examples, the charged particle 318 is produced by interactions between the sample and a charged particle beam. In various examples, the charged particle 318 can include back-scattered electrons, Auger electrons, secondary electrons, inelastically scattered electrons (i.e., for energy loss spectroscopy), elastically scattered electrons, or variants of the above involving ions rather than electrons.

While the sensor layer 104 depicted in FIG. 3 includes a semiconductor bulk 314 that directly detects charged particle strikes, other examples of the sensor layer 104 are compatible with the teachings herein. In particular, the sensor layer 104 can include one more scintillator layers coupled with photoamplifier and/or photoelectron layers. The sensor layer 104 can thereby detect radiation emitted, scattered, or transmitted from the sample such as cathodoluminescence photons or x-rays (e.g., for energy dispersive spectroscopy or EDS). It will thus be understood by the skilled person in the art that the charged particle detector systems 100 described herein can, in relevant cases, interact in functionally the same way to detect electromagnetic radiation as is otherwise taught herein with respect to detection of charged particles. Alternatively, the sensor layer 104 can include scintillators and/or particle detectors that interact with charged particles to produce light that is then converted into an electron-hole pair within a portion of the sensor layer. Sensor layers 104 with other activation mechanisms or pathways as known to those skilled in the art are also compatible with the systems described herein.

In some examples, a speed of data readout from the first readout circuit 110 of the active pixel control sensor 102 is greater than a speed of data readout from the second readout circuit 130. Because the structural signal includes information on signal magnitude per pixel, gathering and processing
the data for output as a structural signal using the readout
chip 106 can occur more slowly than reading out the
imaging signal, which is proportional to the total charge in
all pixels.

Readout of the active pixel control sensor 102 to the first
readout circuit 110 and the second readout circuit 130 can be
simultaneous in some examples. For instance, an electron
back-scatter diffraction implementation can use the active
pixel control sensor 102 to output diffraction data from the
second readout circuit 130 at the same that imaging of the
specimen is performed using imaging data from the first
readout circuit 110.

In some examples, a thickness of the semiconductor bulk
314 can be in a range of 50 micrometers to 1 millimeter or
in a range from 300 micrometers to 500 micrometers.

In some examples of sensors described herein, doping of
the semiconductor bulk 314 and the implant section 312 can
be reversed and bias voltage source 118 can be arranged
oppositely to cause electrons 320 to flow downwards
through the solder bump 310 while holes 322 travel upwards
to the backside layer 316.

Figure 4A:
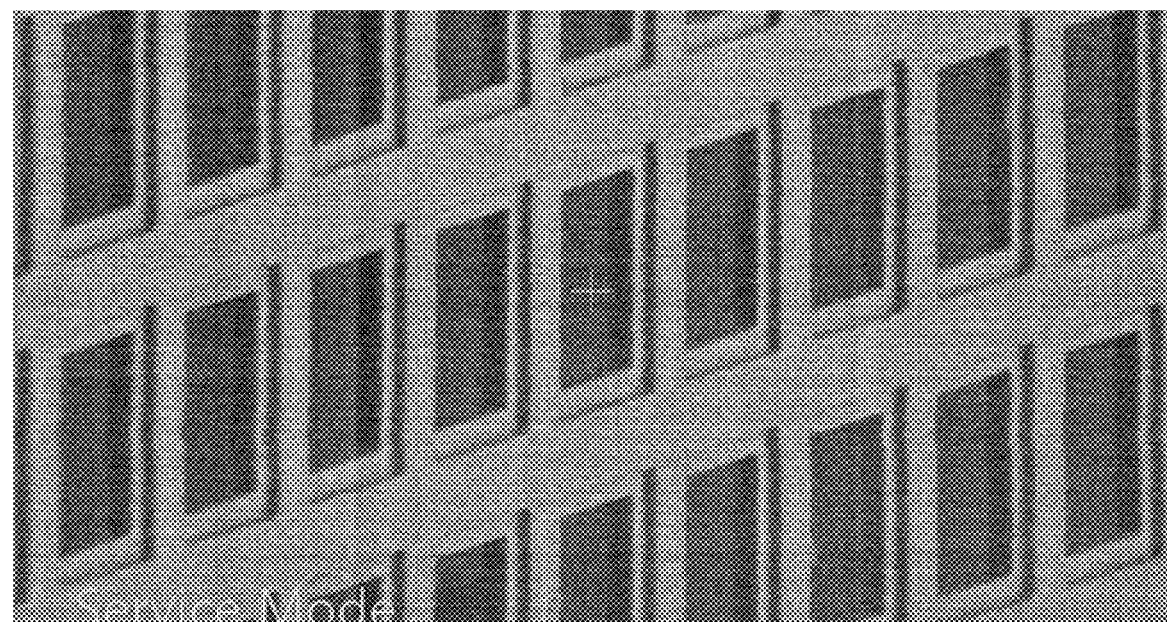
FIG. 4A illustrates an experimental image obtained using the charged particle detector system of the present disclosure at a dwell time of 30 microseconds.
Figure 4B:
FIG. 4B illustrates an experimental image obtained using the charged particle detector system of the present disclosure at a dwell time of 5 microseconds.
Figure 4C:
FIG. 4C illustrates an experimental image obtained using the charged particle detector system of the present disclosure at a dwell time of 1 microsecond.
Figure 4D:
FIG. 4D illustrates an experimental image obtained using the charged particle detector system of the present disclosure at a dwell time of 500 nanoseconds.
Figure 4E:
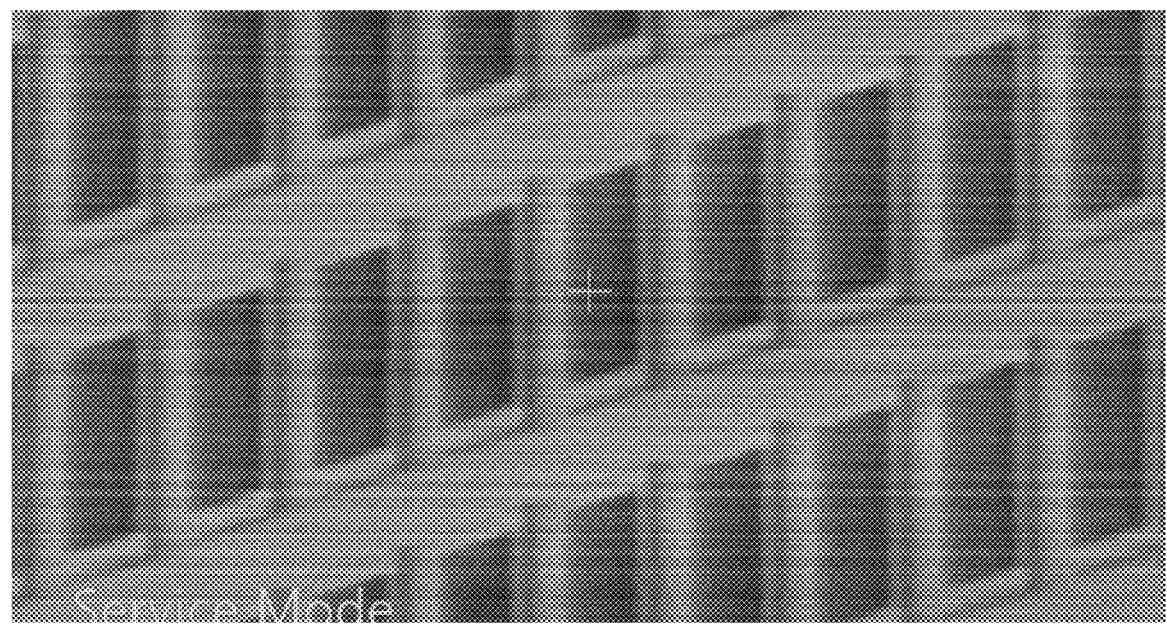
FIG. 4E illustrates an experimental image obtained using the charged particle detector system of the present disclosure at a dwell time of 300 nanoseconds.
Figure 4F:
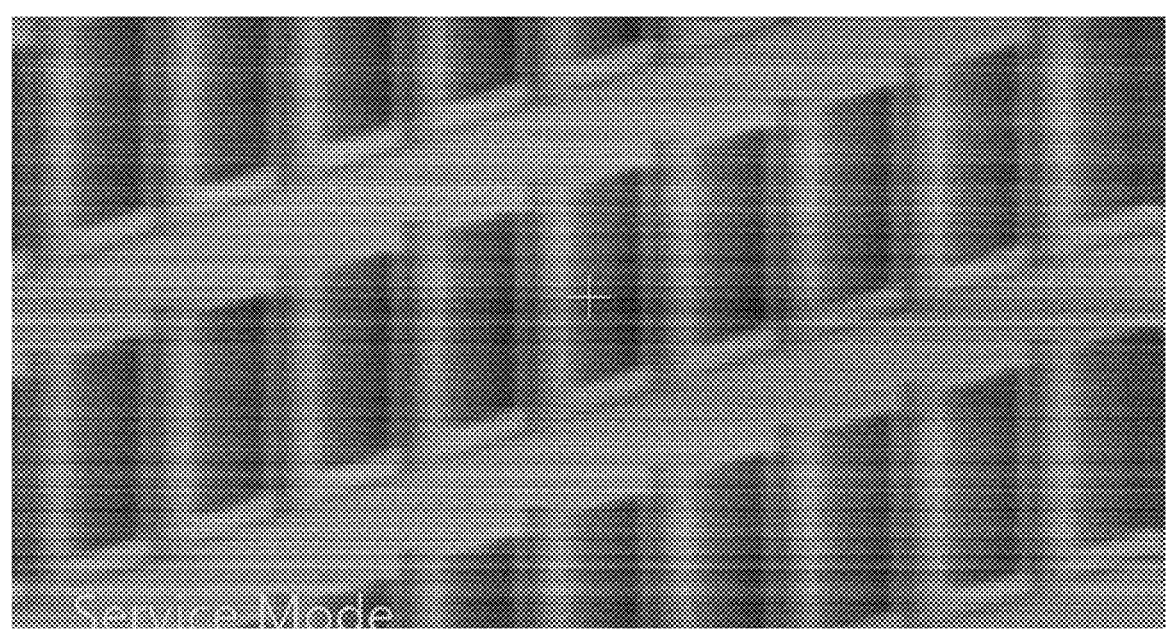
FIG. 4F illustrates an experimental image obtained using the charged particle detector system of the present disclosure at a dwell time of 200 nanoseconds.

FIG. 4A-FIG. 4F illustrate experimental images obtained
using the charged particle detector system 100 of the present
disclosure at different dwell times. As described with respect
to FIG. 2, a charged particle beam (e.g., electron beam of a
scanning electron microscope) is scanned over impact points
in a region of interest on a sample and dwells at each point
for a specified time. During each dwell time, unidimensional
and multidimensional data signals are generated by impact
of scattered charged particles (e.g., electrons) on the active
pixel control sensor 102. Unidimensional data from the
active pixel control sensor 102 that is processed by the first
readout circuit 110 can be used by the user to perform
assistive operations such as to assess or adjust the location
of the region of interest on the sample, to estimate detector
background, to assess whether detector settings need to be
automatically or manually adjusted, or to correct for drift
occurring during acquisition. Each of FIG. 4A through FIG.
4F shows a real-space image generated from unidimensional
signals processed by the first readout circuit 110. In FIG. 4A,
the dwell time for each point in the region of interest is 30
microseconds, and the features of the sample in the region
of interest are clearly identifiable. The dwell time is reduced
to 5 microseconds in FIG. 4B, 1 microsecond in FIG. 4C,
500 nanoseconds in FIG. 4D, 300 nanoseconds in FIG. 4E,
and finally 200 nanoseconds in FIG. 4F. As the dwell time
is reduced, the amount of noise in the image increases and
contrast is reduced. However, surface features of the sample
are still sufficiently visible in FIG. 4F (using a dwell time of
200 nanoseconds) to enable the user to perform assistive
operations.

Figure 5:
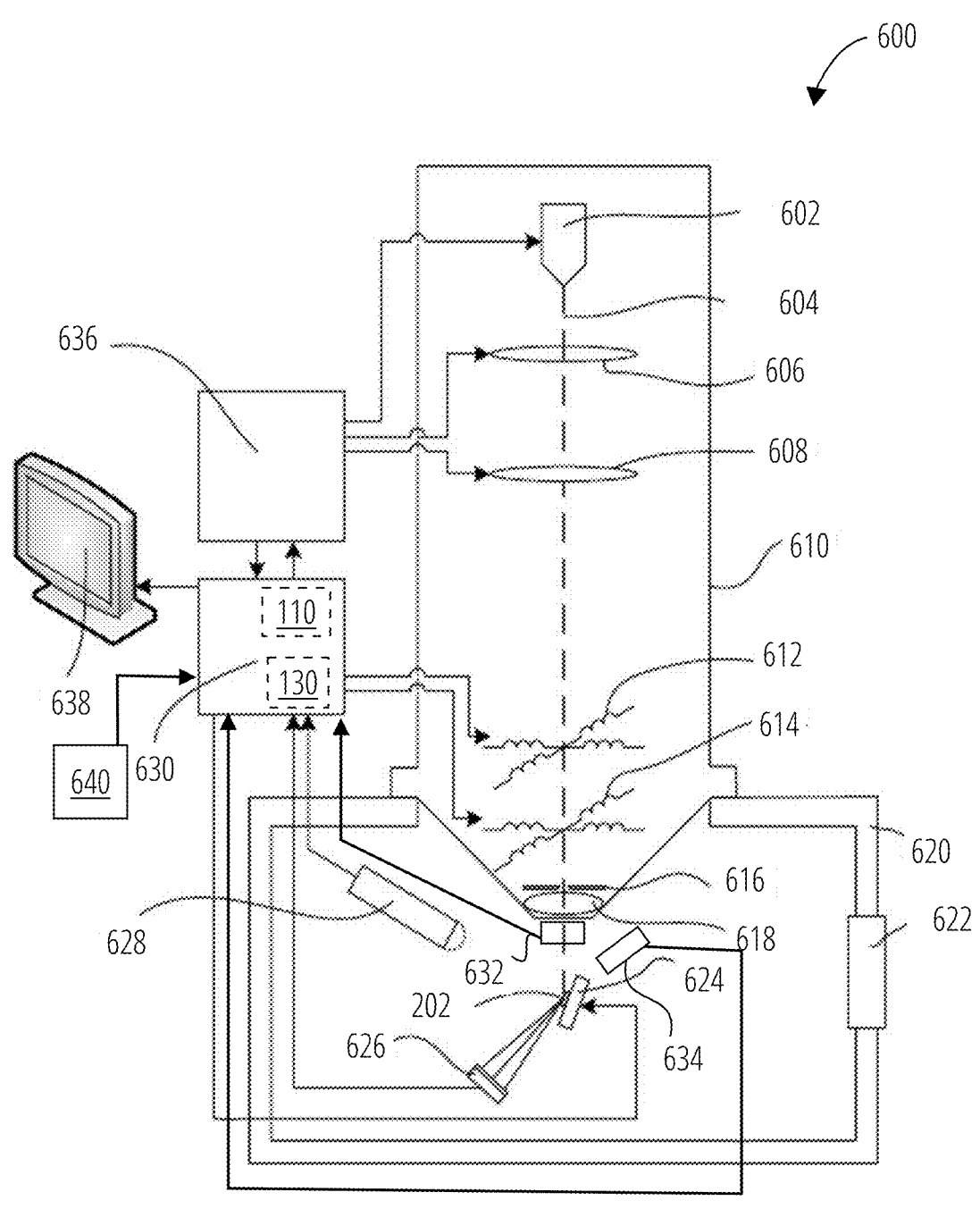
FIG. 5 illustrates an example charged particle imaging system 600 that is used for acquiring images using various imaging modalities according to the present disclosure.

Turning to FIG. 5, an example charged particle imaging
system 600 is illustrated that can be used for acquiring
images using various imaging modalities according to the
present disclosure. In this example, the components of the
charged particle imaging system 600 are appropriate for use
as a scanning electron microscope (SEM), but the skilled
person in the art would appreciate that components could be
substituted are augmented as appropriate to convert the
charged particle imaging system 600 into a focused ion-
beam (FIB), dual-beam, or other charged particle micro-
scope system. The charged particle imaging system 600 can
include a charged particle beam column 610 placed on a
sample chamber 620. The charged particle beam column 610
includes an electron source 602 for producing a beam of
energetic particles (such as electrons or ions) with a selectable energy of, for example, between 500 eV and 30 keV,
along emission axis 604. The charged particle beam can be
manipulated by lenses (606, 608, 618), deflectors (612, 614),
and one or more beam limiting apertures 616 to form a finely
focused spot on a sample 202. Both the charged particle
beam column 610 and the sample chamber 620 can be
connected to a high vacuum pump to evacuate the enclosed
volumes.

The sample chamber 620 can optionally comprise an
airlock 622 for introducing the sample therein and placing
the sample on a sample holder 624. The sample holder 624
can rotate or translate/shift the sample so that the ROI on the
sample surface can be irradiated by the finely focused
electron beam under a selectable tilt angle. The sample
chamber 620 further includes one or more detectors for
receiving particles emitted from the sample. As described
above with respect to FIG. 2 and below with respect to FIG.
6A-FIG. 6C, the active pixel control sensor 102 can be
located at different positions within the sample chamber 620
to accommodate different imaging modalities. In FIG. 5,
each of these positions for the active pixel control sensor 102
are shown in a single image although in most examples only
one active pixel control sensor 102 is employed at one of the
positions. However, it is contemplated that additional active
pixel control sensors 102 can be placed inside the sample
chamber 620 at different locations to enable one charged
particle imaging system 600 to obtain data from multiple
imaging modalities. It is also contemplated that the charged
particle imaging system 600 could include the active pixel
control sensor 102 at one location as shown in FIG. 5 while
conventional sensors are located at one or more of the other
locations.

The sample can be positioned at different angles relative
to the emission axis 604 to acquire different images of the
sample. In some examples, a SEM image can be acquired
when the active pixel control sensor 102 is located at a first
position 628 by positioning the surface of the sample 202
facing the incident beam. That is, a sample axis is aligned
with the emission axis 604. EBSD patterns can be acquired
when the active pixel control sensor 102 is located at a
second position 626 by positioning the sample 202 at an
angle of about 70 degrees relative to the emission axis 604.
Alternatively, EBSD patterns can be acquired (e.g., utilizing
reflected Kikuchi diffraction) when the active pixel control
sensor 102 is at the third position 632 by positioning the
sample 202 at an angle of less than 45 degrees relative to the
emission axis 604. In some embodiments, the SEM image
can also be acquired by positioning the sample at an angle
relative to the emission axis. The active pixel control sensor
102 can be located at a fourth position 634 to detect x-rays
for EDS analysis.

In some embodiments, the voltages and/or currents
needed for the working of the (magnetic or electrostatic)
lenses and of the electron source are generated/controlled by
a column controller 636, while a computing device 630
generates deflection signals for the deflectors and processes
data from the first readout circuit 110 or the second readout
circuit 130. The computing device 630 can be a computing
device such as the first computing device 112 or second
computing device 134 in some examples or can act as both
the first computing device 112 and the second computing
device 134. The computing device 630 can be connected to
a display 638 for displaying information, such as an image
of the sample 202. The computing device 630 can also
receive operator inputs from the input device 640. The input
device 640 can be a mouse, a keyboard, or a touchpad. The
controller can translate, shift, or tilt the sample relative to the incident beam by moving the sample holder 624. The computing device 630 can scan the sample with the charged particle beam by adjusting the beam via the deflector 612 and/or deflector 614.

As described in detail above, the computing device 630 is configured to process data received from the first readout circuit 110 or second readout circuit 130 and can thereby reconstruct, for example, an SEM image, EBSD patterns or crystallographic orientation image of the sample. In some embodiments, the computing device 630 can include one or more field-programmable gate arrays (FPGA) configured to process data from the first readout circuit 110 or the second readout circuit 130 or signals from other secondary detectors installed in the charged particle imaging system 600.

Though a SEM system is described by way of example, it should be understood that the imaging system can be other types of charge-particle microscopy system, such as transmission electron microscopy (TEM), scanning transmission electron microscopy (STEM), or a dual beam tool such as a focused ion beam combined with scanning electron microscopy (FIB-SEM). The present discussion of the SEM system is provided merely as an example of one suitable imaging system for acquiring backscattered electrons.

Figure 6B:
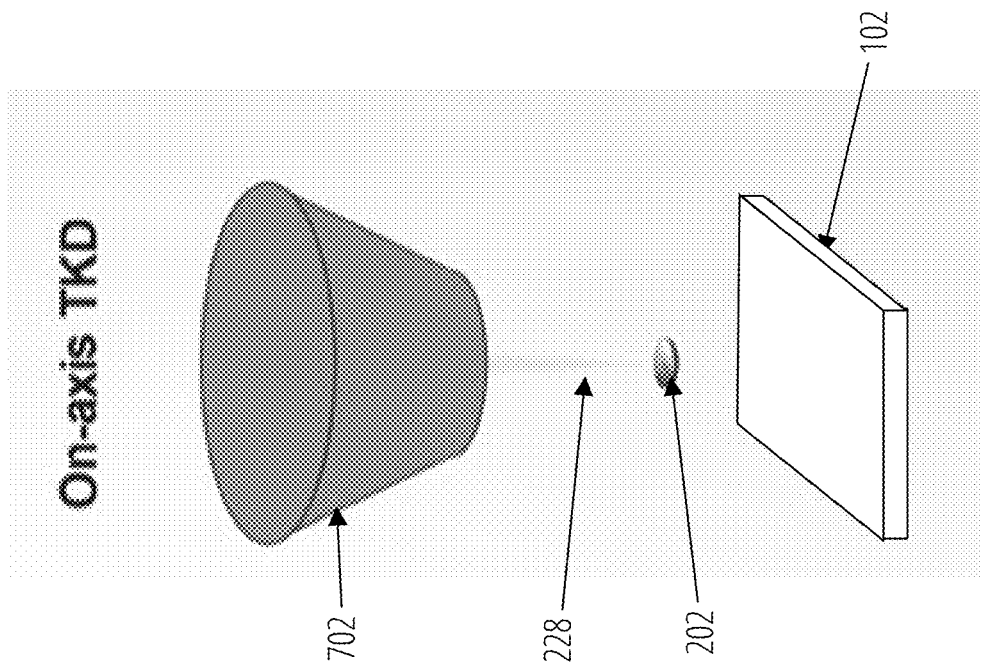
FIG. 6B illustrates the detector arrangement for an on-axis transmitted Kikuchi diffraction (TKD) imaging modality or a four-dimensional scanning transmission electron microscopy (4-D STEM) imaging modality in accordance with some examples described herein.
Figure 6A:
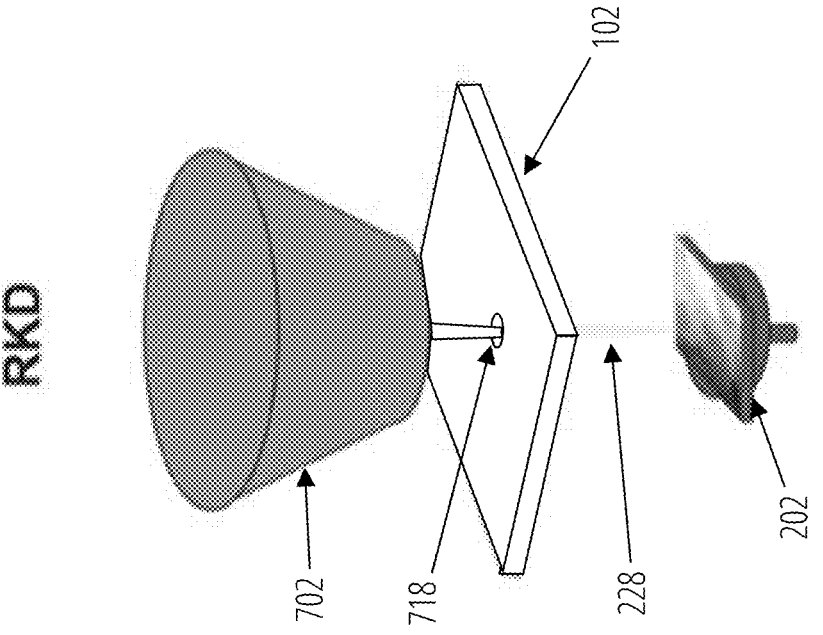
FIG. 6A illustrates the detector arrangement for a reflected Kikuchi diffraction (RKD) imaging modality in accordance with some examples described herein.

FIG. 6A illustrates the detector arrangement for a reflected Kikuchi diffraction (RKD) imaging modality in accordance with some examples described herein. In RKD, the active pixel control sensor 102 is placed between the sample 202 and the final elements of the charged particle beam column represented in this figure as a column lens 702. In some examples, the active pixel control sensor 102 includes a hole or aperture 718 through which the charged particle beam 228 passes on its way to the sample 202. In other examples, two or four active pixel control sensors 102 can be tiled together with an appropriate gap between them to allow the charged particle beam 228 to pass through unimpeded. Upon interaction of the charged particle beam 228 with the sample 202, charged particles (e.g., electrons or ions) are scattered, reflected, or emitted from the sample 202 in a direction that is nearly antiparallel with the initial charged particle beam 228 and strike the active pixel control sensor 102. In some examples, the active pixel control sensor 102 is oriented so that the sensor layer 104 is facing the sample 202 below, i.e., the sensor layer 104 is on the opposite side of the active pixel control sensor 102 from the column lens 702. Multidimensional data collected in an RKD experiment can be used to identify structural information about the sample such as crystallographic phase or orientation.

In conventional systems, the presence of the RKD detector (for example, a concentric backscatter (CBS) detector or a directional backscatter (DBS) detector) often interferes with the separate imaging detectors as the RKD detector blocks or reduces signal to the imaging detectors when inserted. The use of the present charged particle detector system 100 in RKD imaging is particularly advantageous as there is no need to move or remove the backscatter RKD detector to enable the use of the imaging detector as is usually done in conventional systems. In particular, the charged particle detector system 100 enables the user to obtain back-scattered electron (BSE) images of the sample surface at sufficiently fast speed (e.g., at timescales of tens of microseconds or less) to considerably decrease the time needed to locate the region of interest. In addition, the possibility of simultaneous output of unidimensional data signal and multidimensional data signal enables the collection of background levels of the multidimensional data signal during the time that the user is searching for the region of interest by referring to images generated from the unidimensional data signal. The background levels collected during location adjustment can then be used during processing of subsequent multidimensional data signals at the desired region of interest, thus reducing total acquisition time.

In examples that use multiple active pixel control sensors 102 (i.e., two or four sensors), the unidimensional data signal for each active pixel control sensor 102 can be readout separately (e.g., using separate first readout circuits 110) or the unidimensional data signal from all active pixel control sensors 102 can be read out collectively (e.g., through a single first readout circuit 110). In embodiments where the active pixel control sensors 102 are readout separately, the unidimensional data output from each individual first readout circuit 110 can be compared or combined to produce images with differential contrast, i.e., orientation, atomic density, or topographical contrast.

FIG. 6B illustrates the detector arrangement for an on-axis transmitted Kikuchi diffraction (TKD) imaging modality or a four-dimensional scanning transmission electron microscopy (4-D STEM) imaging modality in accordance with some examples described herein. Here, the active pixel control sensor 102 is placed behind the sample 202 and receives charged particles that are scattered, reflected, emitted, or transmitted through the sample 202 on substantially the same axis as the charged particle beam 228 after interaction of the charged particle beam 228 with the sample 202. The active pixel control sensor 102 can output both a unidimensional data signal and a multidimensional data signal to enable reconstruction of both a direct image of the field of view (e.g., a density contrast image similar to that obtained by a transmission electron microscope) and a structural image of the field of view where structural information about each location in the field of view (e.g., crystallographic phase or orientation) is represented in the image.

Figure 6C:
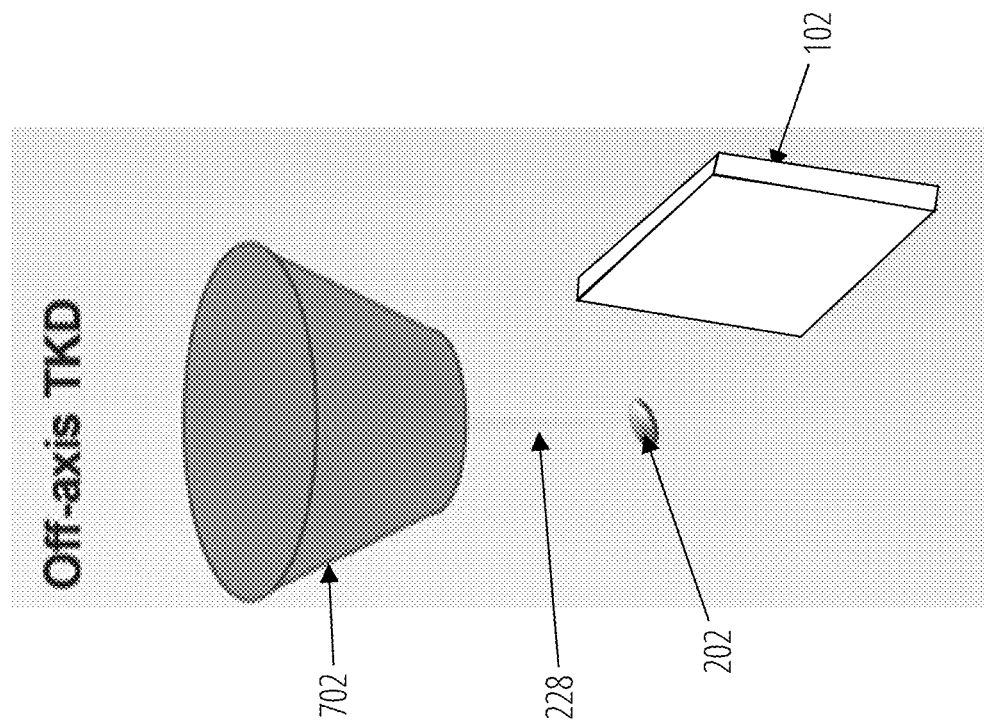
FIG. 6C illustrates the detector arrangement for an off-axis transmitted Kikuchi diffraction (TKD) imaging modality in accordance with some examples described herein.

FIG. 6C illustrates the detector arrangement for an off-axis transmitted Kikuchi diffraction (TKD) imaging modality in accordance with some examples described herein. Here, the active pixel control sensor 102 is placed behind the sample 202 and receives charged particles that are scattered, reflected, emitted, or transmitted through the sample 202 at an angle with respect to the axis of the charged particle beam 228 after interaction of the charged particle beam 228 with the sample 202. In some examples, the active pixel control sensor 102 is positioned to receive particles from the sample 202 at an angle of about 70° with respect to the transmission axis of the charged particle beam 228. The active pixel control sensor 102 can output both a unidimensional data signal and a multidimensional data signal to enable reconstruction of both a direct image of the field of view (e.g., a density contrast image similar to that obtained by a transmission electron microscope) and a structural image of the field of view where structural information about each location in the field of view (e.g., crystallographic phase or orientation) is represented in the image.

Figure 7:
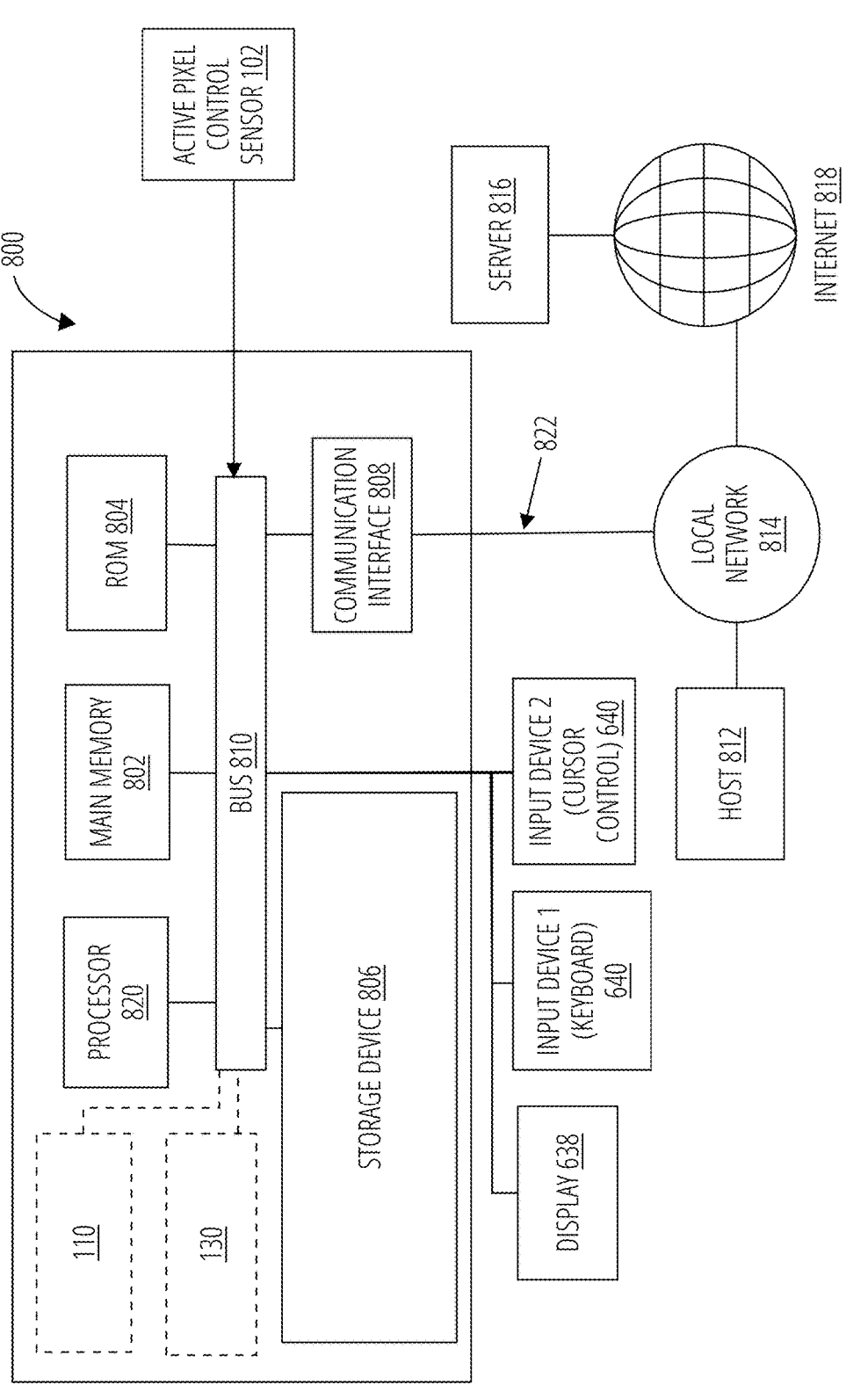
FIG. 7 is a block diagram that illustrates a computing device that are appropriate for use with examples as taught herein.

FIG. 7 is a block diagram that illustrates a computing device 800 that are appropriate for use with examples as taught herein. For example, the computing device 800 can operate as the first computing device 112 or second computing device 134 as described above or can perform functions of both the first computing device 112 and the second computing device 134. The computing device 800 can be an example of computing hardware included with charged particle detector system 100 such as the first computing device 112 or the second computing device 134. Computing device 800 at least includes a bus 810 or other communication mechanism for communicating information, and one or more processors 820 coupled with bus 810 for processing information. The processor 820 can be, for example, a general-purpose microprocessor or other hardware processor. The computing device 800 can be used to implement the methods and techniques disclosed herein, such as method 900.

Computing device 800 also includes a main memory 802, such as a random-access memory (RAM) or other dynamic storage device, coupled to bus 810 for storing information and instructions to be executed by processor 820. Main memory 802 also can be used for storing temporary variables or other intermediate information during execution of instructions to be executed by processor 820. Such instructions, when stored in non-transitory storage media accessible to processor 820, render computing device 800 into a special-purpose machine that is customized to perform the operations specified in the instructions.

Computing device 800 can further include a read-only memory 804 (ROM) or other static storage device coupled to bus 810 for storing static information and instructions for processor 820. A storage device 806, such as a magnetic disk or optical disk, can be provided and coupled to bus 810 for storing information and instructions.

Computing device 800 can be coupled via bus 810 to a display 638, such as a cathode ray tube (CRT) or flat-screen display, for displaying information to a computer user. An input device 640, including alphanumeric and other keys, is coupled to bus 810 for communicating information and command selections to processor 820. Another type of user input device 640 is cursor control, such as a mouse, a trackball, a touchscreen, or cursor direction keys for communicating direction information and command selections to processor 820 and for controlling cursor movement on display 638. This input device typically has two degrees of freedom in two axes, a first axis (e.g., x) and a second axis (e.g., y), that allows the device to specify positions in a plane.

In some embodiments, all or a portion of the first readout circuit 110, the second readout circuit 130, or both the first readout circuit 110 and the second readout circuit 130 can be physically housed within the computing device 800. For example, the readout circuits can be implemented on printed circuit boards that are inserted into a housing that houses one or more of the other components of the computing device 800. This arrangement is optional as the first readout circuit 110, second readout circuit 130, or both circuits can be implemented as standalone units in other examples. The first readout circuit 110 and second readout circuit 130 can connect to the bus 810 of the computing device 800 to enable data transfer and analysis by the processor 820. In some examples, the active pixel control sensor 102 can connect directly to the first readout circuit 110 or second readout circuit 130 or can connect through the bus 810 to the first readout circuit 110 or the second readout circuit 130.

Computing device 800 can implement the techniques described herein using customized hard-wired logic, one or more application specific integrated circuits (ASICs) or field-programmable gate arrays (FPGAs), firmware and/or program logic which in combination with the computer system causes or programs computing device 800 to be a special-purpose machine. According to one embodiment, the techniques herein are performed by computing device 800 in response to processor 820 executing one or more sequences of one or more instructions contained in main memory 802. Such instructions can be read into main memory 802 from another storage medium, such as storage device 806. Execution of the sequences of instructions contained in main memory 802 causes processor 820 to perform the process steps described herein. In alternative embodiments, hard-wired circuitry can be used in place of or in combination with software instructions.

The term "storage media" as used herein refers to any non-transitory media that store data and/or instructions that cause a machine to operate in a specific fashion. Such storage media can comprise non-volatile media and/or volatile media. Non-volatile media includes, for example, optical or magnetic disks, such as storage device 806. Volatile media includes dynamic memory, such as main memory 802. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but can be used in conjunction with transmission media. Transmission media participates in transferring information between storage media. For example, transmission media includes coaxial cables, copper wire and fiber optics, including the wires that comprise bus 810. Transmission media can also take the form of acoustic or light waves, such as those generated during radio-wave and infra-red data communications.

Various forms of media can be involved in carrying one or more sequences of one or more instructions to processor 820 for execution. For example, the instructions can initially be carried on a magnetic disk or solid-state drive of a remote computer. The remote computer can load the instructions into its dynamic memory and send the instructions over a telephone line using a modem. A modem local to computing device 800 can receive the data on the telephone line and use an infra-red transmitter to convert the data to an infra-red signal. An infra-red detector can receive the data carried in the infra-red signal and appropriate circuitry can place the data on bus 810. Bus 810 carries the data to main memory 802, from which processor 820 retrieves and executes the instructions. The instructions received by main memory 802 can optionally be stored on storage device 806 either before or after execution by processor 820.

Computing device 800 can also include a communication interface 808 coupled to the bus 810. The communication interface 808 provides a two-way data communication coupling the computing device 800 to a network link 822 that is connected to a local network 814. For example, communication interface 808 can be an integrated services digital network (ISDN) card, cable modem, satellite modem, or a modem to provide a data communication connection to a corresponding type of telephone line. As another example, communication interface 808 can be a local area network (LAN) card to provide a data communication connection to a compatible LAN. Wireless links can also be implemented. In any such implementation, communication interface 808 sends and receives electrical, electromagnetic or optical signals that carry digital data streams representing various types of information.

The network link 822 typically provides data communication through one or more networks to other data devices. For example, network link 822 can provide a connection through local network 814 to a host computer 812 or to data equipment operated by an Internet Service Provider (ISP) that provides data communication services through the worldwide packet data communication network now commonly referred to as the internet 818. Local network 814 and internet 818 both use electrical, electromagnetic or optical signals that carry digital data streams. The signals through the various networks and the signals on network link 822 and through communication interface 808, which carry the digital data to and from computing device 800, are example forms of transmission media.

Computing device 800 can send messages and receive data, including program code, through the network(s), network link 822 and communication interface 808. In the Internet example, a server 816 might transmit a requested code for an application program through the internet 818, local network 814 and/or communication interface 808. The received code can be executed by processor 820 as it is received, and/or stored in storage device 806, and/or stored in other volatile or non-volatile storage for later execution.

FIG. 8 illustrates an example method 900 for imaging a sample according to examples taught herein. Although the example method 900 depicts a particular sequence of operations, the sequence can be altered without departing from the scope of the present disclosure. For example, some of the operations depicted can be performed in parallel or in a different sequence that does not materially affect the function of the method 900. In other examples, different components of an example device or system that implements the method 900 can perform functions at substantially the same time or in a specific sequence.

According to some examples, the method 900 includes directing a charged particle beam to a location in a region of interest on a sample (block 904). For example, the charged particle imaging system 600 described above can direct a charged particle beam 228 to the impact point 203 in the ROI 204 of the sample 202. The method 900 also includes receiving, at pixels of an active pixel control sensor 102, charged particles that are emitted, scattered, or transmitted from the location (block 906). For example, the active pixel control sensor 102 can be placed inside the sample chamber 620 at a location (e.g., the first position 628, the second position 626, the third position 632, the fourth position 634, or other suitable positions) such that it can receive charged particles resulting from the interaction of the charged particle beam 228 with the sample 202.

The method 900 then splits into two parallel pathways. These pathways can be performed in parallel (i.e., contemporaneously) or at different times. According to some examples, the method 900 includes transmitting a unidimensional data signal corresponding to one of electrons or holes generated in the active pixel control sensor 102 to a first readout circuit 110 (block 908). For example, the unidimensional data signal is transferred from the sensor layer 104 to the first readout circuit 110. The method 900 also includes generating unidimensional data from the unidimensional data signal using the first readout circuit 110 (block 910). The method 900 also includes generating a pixel in a first image by processing unidimensional data from the first readout circuit 110 (block 912). For example, the first image can be an intensity image 122.

In the second pathway, the method 900 includes transmitting multidimensional data signal corresponding to the other of electrons or holes generated in the active pixel control sensor to a second readout circuit 130 (block 914). For example, the multidimensional data signal is transferred from the readout chip 106 to the second readout circuit 130. The method 900 also includes generating multidimensional data from the multidimensional data signal using the second readout circuit 130. The method 900 also includes generating a pixel in a second image by processing multidimensional data from the second readout circuit 130 (block 918). For example, the second image can be a structural image 136.

According to some examples, the method 900 includes selecting a new location within the region of interest to illuminate (block 920). The method 900 can then be iterated to generate further pixels in the first or second images until all of the locations within the region of interest have been illuminated by the charged particle beam. It will be understood that both pathways may not be performed in each iteration in some examples. For example, the first pathway may be performed in a number of iterations to produce a complete intensity image by using a short dwell time (e.g., hundreds of nanoseconds) of the charged particle beam at the location on the sample to quickly assemble the intensity image 122. Then, the second pathway can be performed one or a number of times to gather multidimensional data at a longer dwell time of the charged particle beam at the location to improve signal-to-noise ratio. The multidimensional data gathering may be interrupted or interspersed with unidimensional data gathering at short dwell time to prepare an intensity image or otherwise determine if the sample location has drifted. Drift corrections can then be applied to the multidimensional data. By performing the method 900, a complete structural image 136 and corresponding intensity image 122 can be generated from signals produced by a single active pixel control sensor 102.

FIG. 9 illustrates an example method 1000 for assembling a charged particle detector system as taught herein. Although the example method 1000 depicts a particular sequence of operations, the sequence may be altered without departing from the scope of the present disclosure. For example, some of the operations depicted may be performed in parallel or in a different sequence that does not materially affect the function of the method 1000. In other examples, different components of an example device or system that implements the method 1000 may perform functions at substantially the same time or in a specific sequence.

According to some examples, the method 1000 includes providing an active pixel control sensor 102 having a sensor layer 104 and a readout chip 106 at block 1002. The method 1000 includes connecting the sensor layer 104 of the active pixel control sensor 102 to a first readout circuit 110 configured to process unidimensional data signals from the sensor layer 104 at block 1004. The method 1000 includes connecting the readout chip 106 of the active pixel control sensor 102 to a second readout circuit 130 configured to process multidimensional data signals from the readout chip 106 at block 1006.

According to some examples, the method 1000 includes connecting a first computing device 112 to the first readout circuit 110 to generate intensity images 122 of a sample 202 from unidimensional data provided by the first readout circuit 110 at block 1008. According to some examples, the method 1000 includes connecting a second computing device 134 to the second readout circuit 130 to generate structural images 136 of the sample 202 from multidimensional data provided by the second readout circuit 130 at block 1010.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

The embodiments described herein can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms such as producing, identifying, determining, or comparing.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

The section headings used herein are for organizational purposes only and are not to be construed as limiting the described subject matter in any way.

In this detailed description of the various embodiments, for purposes of explanation, numerous specific details have been set forth to provide a thorough understanding of the embodiments disclosed. One skilled in the art will appreciate, however, that these various embodiments can be practiced with or without these specific details in some examples. In other instances, structures and devices are shown in block diagram form. Furthermore, one skilled in the art can readily appreciate that the specific sequences in which methods are presented and performed are illustrative and it is contemplated that the sequences can be varied (unless explicitly noted otherwise) and still remain within the spirit and scope of the various embodiments disclosed herein.

All literature and similar materials cited in this application, including but not limited to, patents, patent applications, articles, books, treatises, and internet web pages are expressly incorporated by reference in their entirety for any purpose. Unless described otherwise, all technical and scientific terms used herein have a meaning as is commonly understood by one of ordinary skill in the art to which the various embodiments described herein belongs.

It will be appreciated that there is an implied "about" prior to specific temperatures, concentrations, times, pressures, flow rates, cross-sectional areas, etc. discussed in the present teachings, such that slight and insubstantial deviations are within the scope of the present teachings. In this application, the use of the singular includes the plural unless specifically stated otherwise. Also, the use of "comprise", "comprises", "comprising", "contain", "contains", "containing", "include", "includes", and "including" are not intended to be limiting. It is to be understood that both the foregoing general description and the following detailed description are exemplary and explanatory only and are not restrictive of the present teachings.

As used herein, "a" or "an" also can refer to "at least one" or "one or more" in some instances unless expressly noted to the contrary. Also, the use of "or" is inclusive, such that the phrase "A or B" is true when "A" is true, "B" is true, or both "A" and "B" are true. Further, unless otherwise required by context, singular terms shall include pluralities and plural terms shall include the singular.

A "system" as used herein sets forth a set of components, real or abstract, comprising a whole where each component interacts with or is related to at least one other component within the whole.

Advantages and features of the present disclosure can be further described by the following examples:

Example 1. A charged particle detector system, comprising: an active pixel control sensor having a sensor layer and a readout chip and including a plurality of pixels, each pixel in the plurality of pixels producing at least an electron and a hole upon being struck by a charged particle; a first readout circuit in communication with the sensor layer and configured to receive a unidimensional data signal corresponding to one of the electron or hole produced by the charged particle strike; and a second readout circuit in communication with the readout chip and configured to receive a multidimensional data signal corresponding to the other of the electron or hole produced by the charged particle strike.

Example 2. The charged particle detector system of any of the preceding examples, wherein the first readout circuit includes a current mirror to receive the unidimensional data signal as an input signal and to output at least two mirrored signals corresponding to the input signal.

Example 3. The charged particle detector system of example 2, wherein the first readout circuit includes an amplifier and a peripheral interface adapter, the amplifier receiving one of the mirrored signals from the current mirror.

Example 4. The charged particle detector system of example 2, wherein the first readout circuit includes a bias voltage source that receives one of the mirrored signals from the current mirror.

Example 5. The charged particle detector system of any of the preceding examples, wherein the second readout circuit includes a field programmable gate array that receives and decodes the multidimensional data signal from the readout chip.

Example 6. The charged particle detector system of any of the preceding examples, wherein the unidimensional data signal and the multidimensional data signal are generated by the active pixel control sensor contemporaneously.

Example 7. The charged particle detector system of any of the preceding examples, further comprising: a first computing device that processes the unidimensional data to produce an intensity image; and a second computing device that processes the multidimensional data to produce a structural image.

Example 8. The charged particle detector system of example 7, wherein the intensity image and the structural image are automatically co-registered.

Example 9. The charged particle detector system of example 7, wherein the first computing device and the second computing device are a same computing device.

Example 10. The charged particle detector system of any of the preceding examples, wherein the active pixel control sensor is a monolithic active pixel sensor (MAPS).

Example 11. The charged particle detector system of any of the preceding examples, wherein the active pixel control sensor is a hybrid pixel array detector (HPAD).

Example 12. The charged particle detector system of any of the preceding examples, wherein the active pixel control sensor is configured to be disposed in a position with respect to the sample to measure reflected Kikuchi diffraction.

Example 13. A method of imaging a sample, comprising: receiving charged particles from a sample at a plurality of pixels in an active pixel control sensor, the active pixel control sensor including a sensor layer and a readout chip, each pixel in the plurality of pixels producing at least an electron and a hole upon being struck by a charged particle; transmitting a unidimensional data signal corresponding to one of the electrons or holes produced by the charged particle strikes from the sensor layer to a first readout circuit; generating unidimensional data from the unidimensional data signal using the first readout circuit; transmitting a multidimensional data signal corresponding to the other of the electrons or holes produced by the charged particle strikes from the readout chip to a second readout circuit; and generating multidimensional data from the multidimensional data signal using the second readout circuit.

Example 14. The method of example 13, wherein generating the unidimensional data includes generating two mirrored signals corresponding to the unidimensional data signal using a current mirror.

Example 15. The method of example 14, furthering comprising applying a bias voltage to the active pixel control sensor using a bias voltage source that receives one of the mirrored signals from the current mirror.

Example 16. The method of example 14, wherein generating the unidimensional data further includes amplifying one of the mirrored signals using an amplifier.

Example 17. The method of any of the preceding examples, wherein the steps of transmitting the unidimensional data signal and transmitting the multidimensional data signal happen contemporaneously.

Example 18. The method of any of the preceding examples, further comprising: forming an intensity image of the sample with a first computing device that receives unidimensional data from the first readout circuit; and forming a structural image of the sample with a second computing device that receives multidimensional data from the second readout circuit.

Example 19. The method of any of the preceding examples, wherein the intensity image and the structural image are automatically co-registered.

Example 20. The method of any of the preceding examples, wherein generating the multidimensional data includes receiving and decoding the multidimensional data signal at a field programmable gate array.

What is claimed is:

1. A charged particle detector system, comprising:
an active pixel control sensor having a sensor layer and a readout chip and including a plurality of pixels, each pixel in the plurality of pixels producing at least an electron and a hole upon being struck by a charged particle;
a first readout circuit in communication with the sensor layer and configured to receive a unidimensional data signal corresponding to one of the electron or hole produced by the charged particle strike; and
a second readout circuit in communication with the readout chip and configured to receive a multidimensional data signal corresponding to the other of the electron or hole produced by the charged particle strike.

2. The charged particle detector system of claim 1, wherein the first readout circuit includes a current mirror to receive the unidimensional data signal as an input signal and to output at least two mirrored signals corresponding to the input signal.

3. The charged particle detector system of claim 2, wherein the first readout circuit includes an amplifier and a peripheral interface adapter, the amplifier receiving one of the mirrored signals from the current mirror.

4. The charged particle detector system of claim 2, wherein the first readout circuit includes a bias voltage source that receives one of the mirrored signals from the current mirror.

5. The charged particle detector system of claim 1, wherein the second readout circuit includes a field programmable gate array that receives and decodes the multidimensional data signal from the readout chip.

6. The charged particle detector system of claim 1, wherein the unidimensional data signal and the multidimensional data signal are generated by the active pixel control sensor contemporaneously.

7. The charged particle detector system of claim 1, further comprising:
a first computing device that processes the unidimensional data to produce an intensity image; and
a second computing device that processes the multidimensional data to produce a structural image.

8. The charged particle detector system of claim 7, wherein the intensity image and the structural image are automatically co-registered.

9. The charged particle detector system of claim 7, wherein the first computing device and the second computing device are a same computing device.

10. The charged particle detector system of claim 1, wherein the active pixel control sensor is a monolithic active pixel sensor (MAPS).

11. The charged particle detector system of claim 1, wherein the active pixel control sensor is a hybrid pixel array detector (HPAD).

12. The charged particle detector system of claim 1, wherein the active pixel control sensor is configured to be disposed in a position with respect to the sample to measure reflected Kikuchi diffraction.

13. A method of imaging a sample, comprising:
receiving charged particles from a sample at a plurality of pixels in an active pixel control sensor, the active pixel control sensor including a sensor layer and a readout chip, each pixel in the plurality of pixels producing at least an electron and a hole upon being struck by a charged particle;
transmitting a unidimensional data signal corresponding to one of the electrons or holes produced by the charged particle strikes from the sensor layer to a first readout circuit;
generating unidimensional data from the unidimensional data signal using the first readout circuit;
transmitting a multidimensional data signal corresponding to the other of the electrons or holes produced by the charged particle strikes from the readout chip to a second readout circuit; and
generating multidimensional data from the multidimensional data signal using the second readout circuit.

14. The method of claim 13, wherein generating the unidimensional data includes generating two mirrored signals corresponding to the unidimensional data signal using a current mirror.

15. The method of claim 14, furthering comprising applying a bias voltage to the active pixel control sensor using a bias voltage source that receives one of the mirrored signals from the current mirror.

16. The method of claim 14, wherein generating the unidimensional data further includes amplifying one of the mirrored signals using an amplifier.

17. The method of claim 13, wherein the steps of transmitting the unidimensional data signal and transmitting the multidimensional data signal happen contemporaneously.

18. The method of claim 13, further comprising:

forming an intensity image of the sample with a first computing device that receives unidimensional data from the first readout circuit; and forming a structural image of the sample with a second computing device that receives multidimensional data from the second readout circuit.

19. The method of claim 13, wherein the intensity image and the structural image are automatically co-registered.

20. The method of claim 13, wherein generating the multidimensional data includes receiving and decoding the multidimensional data signal at a field programmable gate array.

\* \* \* \* \*